(12) United States Patent
Tseng et al.

(10) Patent No.: US 11,227,795 B2
(45) Date of Patent: Jan. 18, 2022

(54) INTEGRATED CIRCUIT PACKAGE AND METHOD

(71) Applicant: Taiwan Semiconductor Manufacturing Company, Ltd., Hsinchu (TW)

(72) Inventors: Ting-Chen Tseng, Hsinchu (TW); Sih-Hao Liao, New Taipei (TW); Po-Han Wang, Hsinchu (TW); Yu-Hsiang Hu, Hsinchu (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/745,991

(22) Filed: Jan. 17, 2020

(65) Prior Publication Data

US 2021/0225699 A1 Jul. 22, 2021

(51) Int. Cl.
- *H01L 21/768* (2006.01)
- *H01L 21/22* (2006.01)
- *H01L 21/311* (2006.01)

(52) U.S. Cl.
CPC ........ *H01L 21/76822* (2013.01); *H01L 21/22* (2013.01); *H01L 21/76838* (2013.01); *H01L 21/31144* (2013.01)

(58) Field of Classification Search
None
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |
| 2013/0026468 A1 | 1/2013 | Yoshimuta et al. |
| 2013/0062760 A1 | 3/2013 | Hung et al. |

(Continued)

*Primary Examiner* — Alexander G Ghyka
(74) *Attorney, Agent, or Firm* — Slater Matsil, LLP

(57) ABSTRACT

In an embodiment, a method includes: dispensing a first dielectric layer around and on a first metallization pattern, the first dielectric layer including a photoinsensitive molding compound; planarizing the first dielectric layer such that surfaces of the first dielectric layer and the first metallization pattern are planar; forming a second metallization pattern on the first dielectric layer and the first metallization pattern; dispensing a second dielectric layer around the second metallization pattern and on the first dielectric layer, the second dielectric layer including a photosensitive molding compound; patterning the second dielectric layer with openings exposing portions of the second metallization pattern; and forming a third metallization pattern on the second dielectric layer and in the openings extending through the second dielectric layer, the third metallization pattern coupled to the portions of the second metallization pattern exposed by the openings.

20 Claims, 37 Drawing Sheets

(56) References Cited

U.S. PATENT DOCUMENTS

| | | |
|---|---|---|
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1* | 8/2014 | Yu .......................... H01L 24/97 257/532 |
| 2014/0252646 A1 | 9/2014 | Hung et al. |
| 2014/0264930 A1 | 9/2014 | Yu et al. |
| 2017/0271241 A1* | 9/2017 | Marimuthu ....... H01L 23/49833 |
| 2018/0151477 A1* | 5/2018 | Yu .......................... H01L 24/18 |
| 2018/0331036 A1* | 11/2018 | Zhang ................. H05K 1/0218 |

* cited by examiner

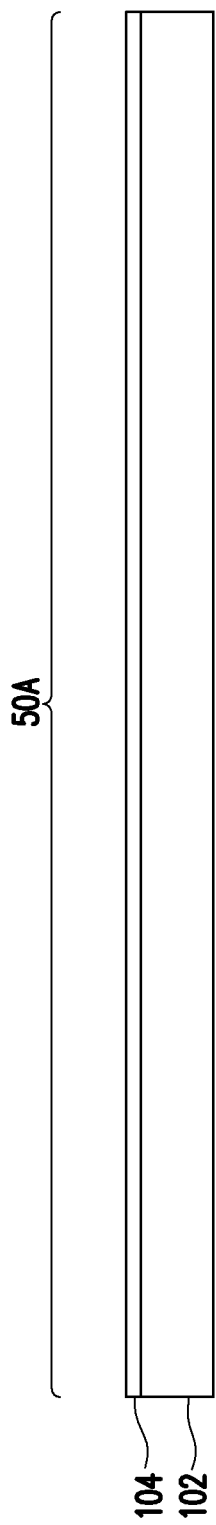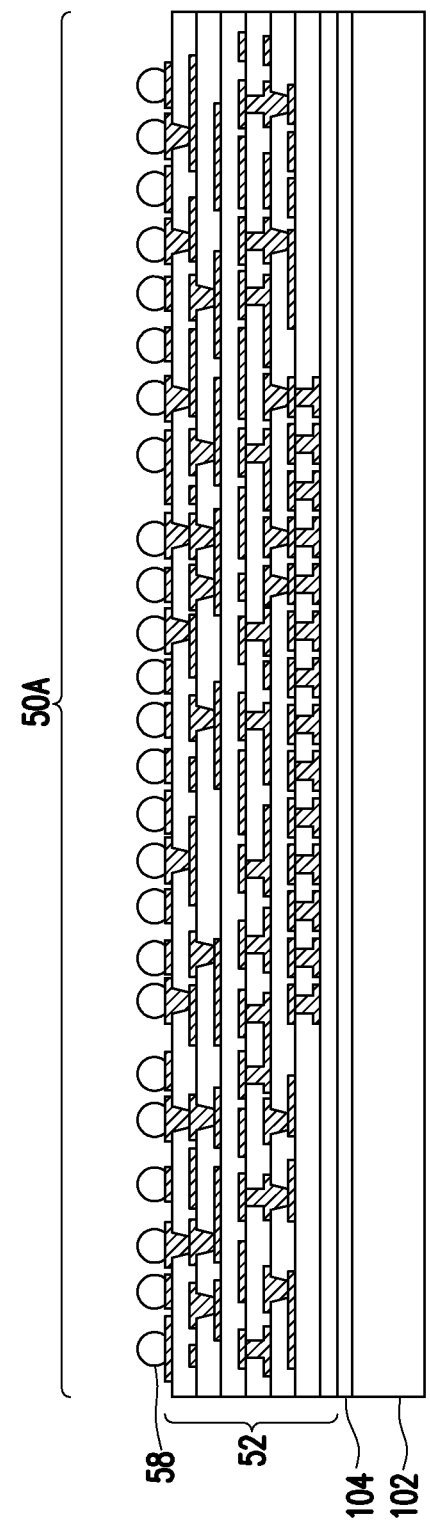

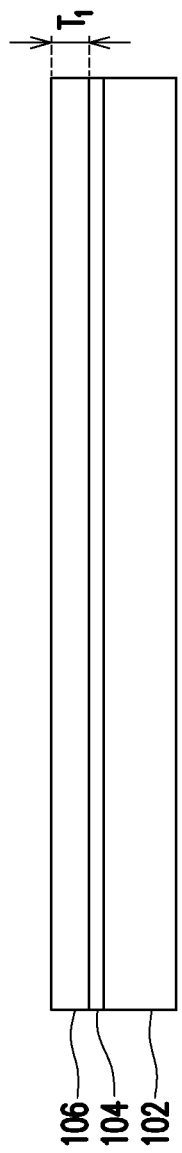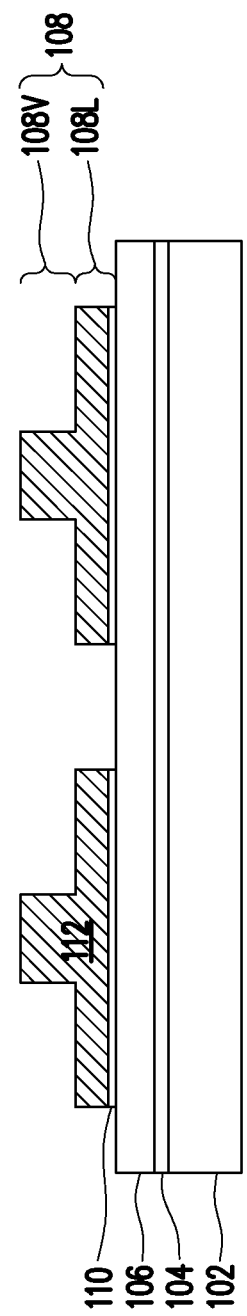
FIG. 3
FIG. 4

INTEGRATED CIRCUIT PACKAGE AND METHOD

BACKGROUND

As semiconductor technologies continue to evolve, integrated circuit dies are becoming increasingly smaller. Further, more functions are being integrated into the dies. Accordingly, the numbers of input/output (I/O) pads needed by dies has increased while the area available for the I/O pads has decreased. The density of the I/O pads has risen quickly over time, increasing the difficulty of die packaging.

In some packaging technologies, integrated circuit dies are singulated from wafers before they are packaged. An advantageous feature of this packaging technology is the possibility of forming fan-out packages, which allow the I/O pads on a die to be redistributed to a greater area. The number of I/O pads on the surfaces of the dies may thus be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 25 are cross-sectional views of intermediate steps during a process for forming a package component, in accordance with some embodiments.

DETAILED DESCRIPTION

Figure 5:
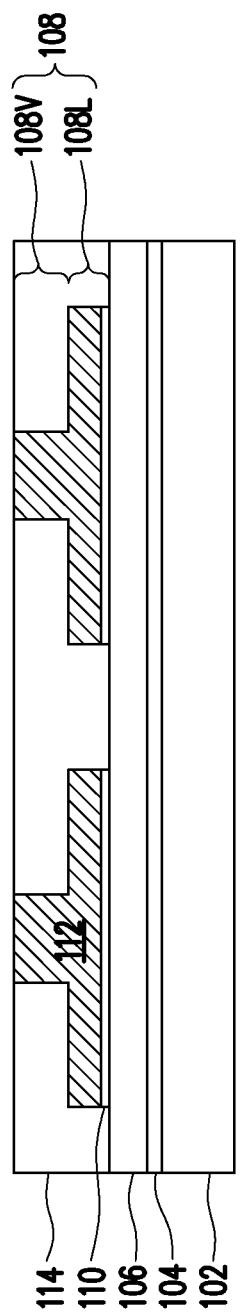

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a redistribution structure is formed comprising dielectric layers and metallization patterns among the dielectric layers. Some of the dielectric layers are formed of molding compound materials that have a small coefficient of thermal expansion (CTE) and a large Young's Modulus. Warpage of the redistribution structure caused by shrinkage of the dielectric layers after formation may thus be reduced. Further, multiple molding compound materials may be used. For example, some dielectric layers can comprise a photoinsensitive molding compound, and other dielectric layers can comprise a photosensitive molding compound. A photosensitive molding compound is a molding compound that can be directly patterned by photolithography before curing, and a photoinsensitive molding compound is a molding compound that cannot be directly patterned by photolithography. The composition of such compounds is discussed further below. The photoinsensitive molding compound has better electrical and mechanical performance, and is particularly suitable for power and/or ground connections. The photosensitive molding compound may be formed at a lower cost, and has sufficient electrical and mechanical performance for data connections.

FIGS. 1 through 25 are cross-sectional views of intermediate steps during a process for forming a package component 50, in accordance with some embodiments. A first package region 50A is shown, in which the package component 50 is formed. It should be appreciated that multiple adjacent package regions 50A can be simultaneously formed, and a package component 50 can be formed in each of the package regions 50A.

Figure 25:
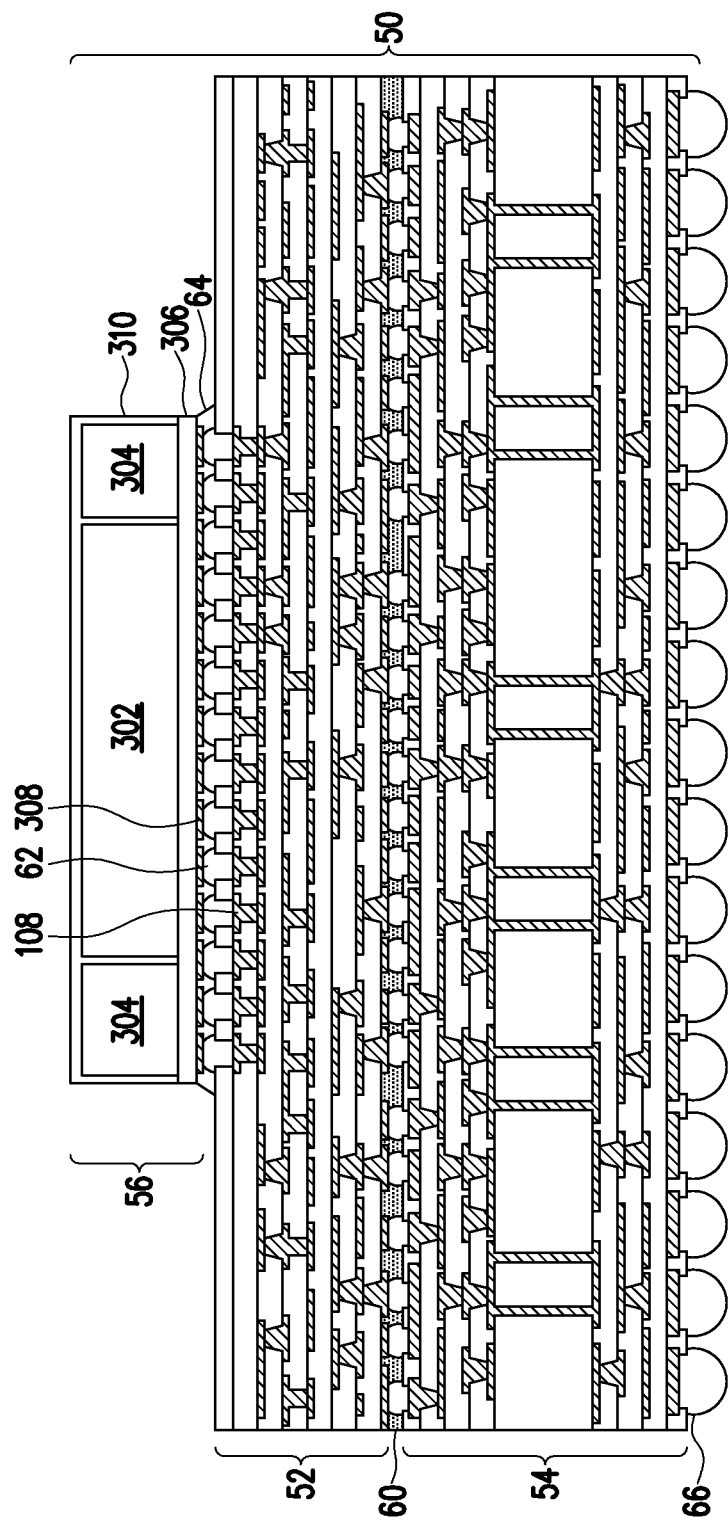

FIG. 25 illustrates the resulting package component 50. The package component 50 includes a redistribution structure 52, an interposer 54, and a semiconductor device 56. The redistribution structure 52 is disposed between the interposer 54 and the semiconductor device 56. The semiconductor device 56 is a three-dimensional integrated circuit (3DIC) device, such as a chip-on-wafer (CoW) device, that incorporates multiple integrated circuit dies in a side-by-side manner. The interposer 54 and semiconductor device 56 are parts of a package substrate, on which the semiconductor device 56 is mounted. The package component 50 is a package implementing the 3DIC device, such as a chip-on-wafer-on-substrate (CoWoS) package.

The redistribution structure 52 is attached to the interposer 54 with conductive connectors 58, and an underfill 60 may be formed around the conductive connectors 58. The semiconductor device 56 is attached to the redistribution structure 52 with conductive connectors 62, and an underfill 64 may be formed around the conductive connectors 62. The package component 50 may also include external connectors 66, which are used to physically and electrically couple the package component 50 to external devices.

The redistribution structure 52 and interposer 54 collectively redistribute and fan-out connections from the semiconductor device 56 for electrical coupling to external connectors. The redistribution structure 52 has small conductive features for coupling to the semiconductor device 56, and the interposer 54 has large conductive features for coupling to the external connectors 66. The redistribution structure 52 is formed by photolithography techniques, which are suitable for producing small conductive features at a low cost, and the interposer 54 is formed by laser drilling techniques, which are suitable for producing large conductive features at a low cost. By combining the redistribution structure 52 and interposer 54 in a same package component 50, manufacturing costs may be reduced.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a large degree of planarity.

In FIG. 2, the redistribution structure 52 is formed on the release layer 104, and the conductive connectors 58 are formed on the redistribution structure 52. FIGS. 3 through 17 are various views of intermediate steps during a process for forming the redistribution structure 52, in accordance with some embodiments. A detailed view of a region of the redistribution structure 52 is shown. Some features in FIGS. 3 through 17 are omitted from FIG. 2 for simplicity of illustration. The redistribution structure 52 includes dielectric layers 106, 114, 122, 132, 140, 150, 160; metallization patterns 108, 116, 126, 134, 144, 154; and under-bump metallurgies (UBMs) 164. The redistribution structure 52 is shown as an example having six layers of metallization patterns. More or fewer dielectric layers and metallization patterns may be formed in the redistribution structure 52 by, respectively, repeating or omitting the steps and process discussed herein.

As discussed further below, the dielectric layers 114, 122, 132, 140, 150, 160 are formed of molding compound materials that each have a small coefficient of thermal expansion (CTE) and a large Young's Modulus. Wafer warpage of the redistribution structure 52 caused by shrinkage of the dielectric layers 114, 122, 132, 140, 150, 160 after formation may thus be reduced. The dielectric layers 106, 114, 122, 132, 140, 150, 160 are shown as an example. In this embodiment, the dielectric layer 106 is formed of a photosensitive polymer, the dielectric layers 114, 132 are formed of a photoinsensitive molding compound, and the dielectric layers 122, 140, 150, 160 are formed of a photosensitive molding compound. In other embodiments (discussed further below) the redistribution structure 52 may comprise other combinations of dielectric layers.

In FIG. 3, the dielectric layer 106 is deposited over the carrier substrate 102, e.g., on the release layer 104. The dielectric layer 106 may be a photosensitive polymer such as polybenzoxazole (PBO), polyimide, low temperature polyimide (LTPI), benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The dielectric layer 106 may be formed, for example, by spin coating, lamination, chemical vapor deposition (CVD), or the like.

In some embodiments, the dielectric layer 106 is formed of a photosensitive polymer such as LTPI, which allows the dielectric layer 106 to be formed to a small thickness $T_1$, such as a thickness $T_1$ in the range of about 7 µm to about 8 µm. A photosensitive polymer can be formed by spin coating, which can obviate the need to planarize the dielectric layer 106. Formation costs of the dielectric layer 106 may thus be reduced, but as a result, the dielectric layer 106 can have a small degree of planarity, such as less than about 50%. The dielectric layer 106 is a single continuous dielectric material layer, and so it has a small surface roughness, such as a roughness of less than about 0.1 µm.

The dielectric layer 106 has poor electrical and mechanical performance. In particular, the photosensitive polymer has a small Young's Modulus and a large CTE, both of which can result in damage to the subsequently formed metallization patterns during testing and/or operation. For example, the photosensitive polymer can have a Young's Modulus of less than 8.5 GPa, such as in the range of about 2.7 GPa to about 3.3 GPa, and can have a CTE of greater than about 20 ppm/K, such as in the range of about 50 ppm/K to about 70 ppm/K. Likewise, the photosensitive polymer has a large dielectric constant ($D_K$) and a large dissipation factor ($D_F$), which may decrease the electrical isolation between the subsequently formed metallization patterns. For example, the photosensitive polymer can have a $D_K$ of greater than 2.8, such as in the range of about 3.1 to about 3.3, and a $D_F$ of greater than about 0.008, such as in the range of about 0.02 to about 0.025. Despite its poor electrical and mechanical performance, the photosensitive polymer of the dielectric layer 106 is a low-cost material, and so using the photosensitive polymer for dielectric layers where electrical and mechanical performance are lesser concerns can advantageously lower manufacturing costs of the redistribution structure 52.

In FIG. 4, the metallization pattern 108 is formed on the dielectric layer 106. The metallization pattern 108 includes conductive lines 108L on and extending along the major surface of the dielectric layer 106. The metallization pattern 108 also includes conductive vias 108V on the conductive lines 108L. As an example to form the metallization pattern 108, a seed layer 110 is formed over the dielectric layer 106. In some embodiments, the seed layer 110 is a metal layer, which may be a single layer or a composite layer comprising a plurality of sub-layers formed of different materials. In some embodiments, the seed layer 110 comprises a titanium layer and a copper layer over the titanium layer. The seed layer 110 may be formed using, for example, physical vapor deposition (PVD) or the like. A first photoresist is then formed and patterned on the seed layer 110. The first photoresist may be formed by spin coating or the like and may be exposed to light for patterning. The pattern of the first photoresist corresponds to the conductive lines 108L. The patterning forms openings through the first photoresist to expose the seed layer 110. A conductive material 112 is then formed in the openings of the first photoresist and on the exposed portions of the seed layer 110. The conductive material 112 may be formed by plating, such as electroplating or electroless plating, or the like. The conductive material 112 may comprise a metal, like copper, titanium, tungsten, aluminum, or the like. The first photoresist is then removed, such as by an acceptable ashing or stripping process, such as using an oxygen plasma or the like. A second photoresist is then formed and patterned on the seed layer 110 and conductive lines 108L. The second photoresist may be formed by spin coating or the like and may be exposed to light for patterning. The pattern of the second photoresist corresponds to the conductive vias 108V. The patterning forms openings through the second photoresist to expose the conductive lines 108L. Additional conductive material 112 is then formed in the openings of the second photoresist and on the exposed portions of the conductive lines 108L. The additional conductive material 112 may be formed by plating from the conductive lines 108L, without forming a seed layer on the conductive lines 108L. The combination of the conductive material 112 and underlying portions of the seed layer 110 form the metallization pattern 108. The second photoresist and portions of the seed layer 110 on which the conductive material 112 is not formed are removed. The second photoresist may be removed by an acceptable ashing or stripping process, such as using an oxygen plasma or the like. Once the second photoresist is removed, exposed portions of the seed layer 110 are removed, such as by using an acceptable etching process, such as by wet or dry etching.

In FIG. 5, the dielectric layer 114 is formed around the metallization pattern 108 and on the dielectric layer 106. After formation, the dielectric layer 114 surrounds the metallization pattern 108. In some embodiments, the dielectric layer 114 is formed of a photoinsensitive molding compound. A photoinsensitive molding compound includes a photoinsensitive resin having fillers disposed therein. Examples of photoinsensitive resins include epoxy, acrylic, or polyimide-based materials. Examples of fillers include silica or the like. The fillers have a large diameter and occupy a large portion of the dielectric layer 114. For example, the fillers can have a diameter in the range of about 1 µm to about 5 µm, and can occupy from about 70% to about 90% of the volume of the dielectric layer 114. In some embodiments, an adhesion promoter is formed on metal features such as the metallization pattern 108 before the dielectric layer 114 is formed, which can increase adhesion of the dielectric layer 114 to the metal features. Example adhesion promoters include amine-based, silane-based, thiol-based, or vinyl-based organic materials. Use of an adhesion promoter can increase adhesion of the dielectric layer 114 to metal features such as the metallization pattern 108. The photoinsensitive molding compound may be applied by compression molding, transfer molding, or the like, and may be applied in liquid or semi-liquid form and then subsequently cured. The photoinsensitive molding compound has a low curing temperature, such as a curing temperature in the range of about 160° C. to about 230° C., which can further reduce warpage of the dielectric layer 114 after curing.

The photoinsensitive molding compound has a large Young's Modulus and a small CTE, both of which can provide protection for the metallization pattern 108. For example, the photoinsensitive molding compound can have a Young's Modulus of at least about 8 GPa, such as in the range of about 8 GPa to about 10 GPa, and a CTE of less than or equal to about 20 ppm/K, such as in the range of about 15 ppm/K to about 20 ppm/K. The dielectric layer 114 has a greater Young's Modulus and a lesser CTE than the dielectric layer 106. A large Young's Modulus helps protect the metallization pattern 108 from external mechanical forces. Further, a small CTE helps protect the metallization pattern 108 from internal mechanical forces that can be generated when the metallization pattern 108 is exposed to high operating temperatures.

Because the dielectric layer 114 is formed of a photoinsensitive molding compound, it cannot be patterned by photolithography after formation. As such, the dielectric layer 114 is formed after the metallization pattern 108, and is formed over the metallization pattern 108 such that the metallization pattern 108 is buried or covered, and a planarization process is then performed on the dielectric layer 114 to expose the conductive vias 108V. Topmost surfaces of the dielectric layer 114 and conductive vias 108V are planar after the planarization process. The planarization process may be, for example, a chemical-mechanical polish (CMP). After the planarization process, the photoinsensitive molding compound of the dielectric layer 114 has a large degree of planarity, such as a degree of planarity of greater than about 90%. Further, because the photoinsensitive molding compound contains fillers, it can have a large surface roughness. For example, after the planarization process, the dielectric layer 114 can have a surface roughness in the range of about 0.1 µm to about 0.2 µm. The dielectric layer 114 can have a greater degree of planarity and surface roughness than the dielectric layer 106.

Figure 6:
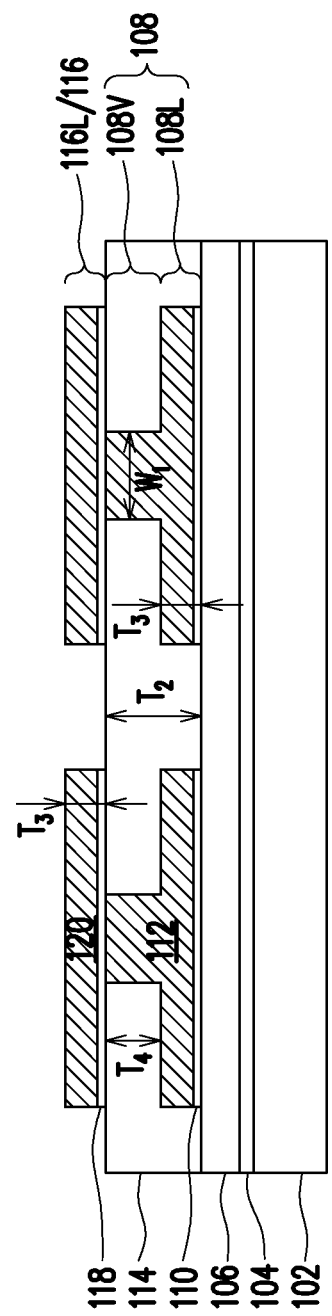

In FIG. 6, the metallization pattern 116 is formed on the dielectric layer 114 and exposed portions of the conductive vias 108V. The metallization pattern 116 only includes conductive lines 116L, and does not have conductive vias. As discussed below, the overlying metallization pattern 126 (see FIG. 8) includes lower conductive vias $126V_L$ that will couple the conductive lines 116L, thus obviating the need for conductive vias in the metallization pattern 116 in this embodiment. As an example to form the metallization pattern 116, a seed layer 118 is formed over the dielectric layer 114 and exposed portions of the conductive vias 108V. In some embodiments, the seed layer 118 is a metal layer, which may be a single layer or a composite layer comprising a plurality of sub-layers formed of different materials. In some embodiments, the seed layer 118 comprises a titanium layer and a copper layer over the titanium layer. The seed layer 118 may be formed using, for example, PVD or the like. A photoresist is then formed and patterned on the seed layer 118. The photoresist may be formed by spin coating or the like and may be exposed to light for patterning. The pattern of the photoresist corresponds to the metallization pattern 116. The patterning forms openings through the photoresist to expose the seed layer 118. A conductive material 120 is then formed in the openings of the photoresist and on the exposed portions of the seed layer 118. The conductive material 120 may be formed by plating, such as electroplating or electroless plating, or the like. The conductive material 120 may comprise a metal, like copper, titanium, tungsten, aluminum, or the like. The combination of the conductive material 120 and underlying portions of the seed layer 118 form the metallization pattern 116. The photoresist and portions of the seed layer 118 on which the conductive material 120 is not formed are removed. The photoresist may be removed by an acceptable ashing or stripping process, such as using an oxygen plasma or the like. Once the photoresist is removed, exposed portions of the seed layer 118 are removed, such as by using an acceptable etching process, such as by wet or dry etching.

The dielectric layer 114 is formed to a large thickness $T_2$, such as a thickness $T_2$ in the range of about 37 µm to about 40 µm. As noted above, the photoinsensitive molding compound of the dielectric layer 114 has a large Young's Modulus. As such, the photoinsensitive molding compound offers a large amount of mechanical support and so may be formed to a greater thickness $T_2$ than a nitride, oxide, or photosensitive polymer. A large thickness $T_2$ may allow the formation of larger conductive vias 108V and larger conductive lines 108L and 116L. In particular, the conductive vias 108V and conductive lines 108L and 116L may be formed to longer lengths and greater dimensions when the dielectric layer 114 is a molding compound. For example, the conductive lines 108L and 116L can each be formed to a large thickness $T_3$, such as a thickness $T_3$ in the range of about 7 µm to about 8 µm, and the conductive vias 108V can be formed to a large thickness $T_4$, such as a thickness $T_4$ in the range of about 30 µm to about 32 µm. Likewise, the conductive vias 108V can be formed to a large width $W_1$, such as a width $W_1$ in the range of greater than about 30 µm, such as in the range of about 27 µm to about 33 µm. Features of longer lengths and greater dimensions may be desirable for some types of connections, such as power and/or ground connections. Further, the photoinsensitive molding compound has a small $D_K$ and $D_F$, which may increase the electrical isolation between the conductive lines 108L and 116L. For example, the photoinsensitive molding compound can have a $D_K$ of greater than 2.8, such as in the range of about 3.1 to about 3.4, and a $D_F$ of less than or equal to about 0.008, such as in the range of about 0.003 to about 0.006. The dielectric layer 114 can have a smaller $D_K$ and $D_F$ than the dielectric layer 106. Increasing the electrical isolation between the conductive lines 108L and 116L may improve electrical performance of the power and ground connections, such as by increasing the power integrity.

Figure 7:
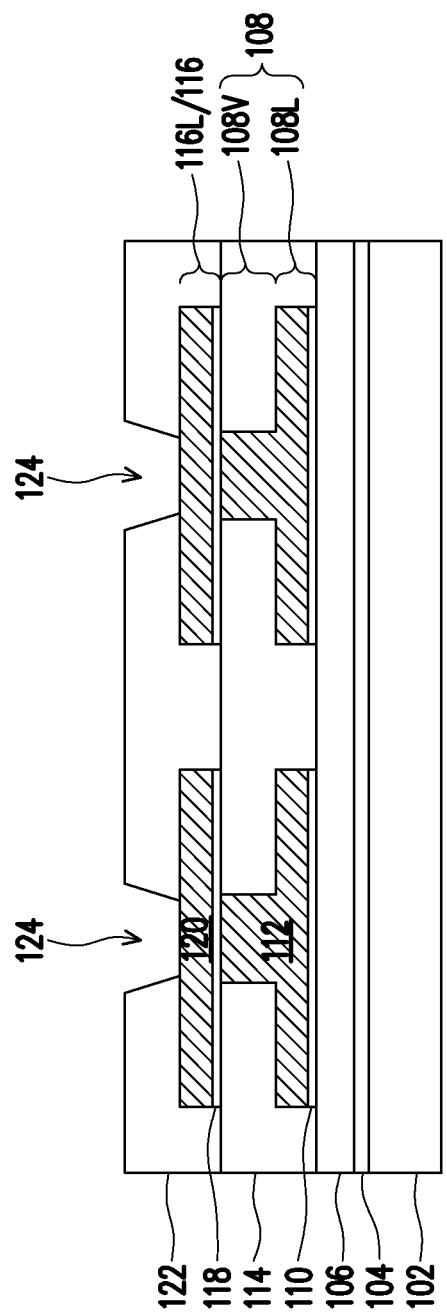

In FIG. 7, the dielectric layer 122 is formed around the metallization pattern 116 and on the dielectric layer 114. After formation, the dielectric layer 122 surrounds and buries or covers the metallization pattern 116. In some embodiments, the dielectric layer 122 is formed of a photosensitive molding compound. A photosensitive molding compound includes a photosensitive resin having fillers disposed therein. Examples of photosensitive resins include epoxy and acrylic. The photosensitive resins can include photoacid generators. Examples of fillers include silica, barium sulfate ($BaSO_4$), or the like. Notably, the photosensitive molding compound of the dielectric layer 122 comprises a different resin and filler than the photoinsensitive molding compound of the dielectric layer 114. Further, the fillers have a small diameter and occupy a small portion of the photosensitive molding compound than the fillers of the photoinsensitive molding compound. For example, the fillers of the photosensitive molding compound can have a diameter in the range of about 0.5 µm to about 2 µm, and can occupy from about 40% to about 60% of the volume of the dielectric layer 122. In some embodiments, the photosensitive molding compound also includes an adhesion promoter, such as amine-based, silane-based, thiol-based, or vinyl-based organic material. The photosensitive molding compound may be applied by compression molding, transfer molding, or the like, and may be applied in liquid or semi-liquid form and then subsequently cured. The photosensitive molding compound has a low curing temperature, such as a curing temperature in the range of about 160° C. to about 230° C., which can further reduce warpage of the dielectric layer 122 after curing.

The photosensitive molding compound has a large Young's Modulus and a small CTE, both of which can provide protection for the metallization pattern 116. For example, the photosensitive molding compound can have a Young's Modulus in the range of about 6 GPa to about 10 GPa, such as at least 8.5 GPa, and a CTE of less than or equal to about 20 ppm/K, such as in the range of about 18 ppm/K to about 35 ppm/K. The dielectric layer 122 has a greater Young's Modulus and a lesser CTE than the dielectric layer 106. A large Young's Modulus helps protect the metallization pattern 116 from external mechanical forces. Further, a small CTE helps protect the metallization pattern 116 from internal mechanical forces that can be generated when the metallization pattern 116 is exposed to high operating temperatures.

The dielectric layer 122 is then patterned. Because the dielectric layer 122 is formed of a photosensitive molding compound, it can be patterned by photolithography after formation. Planarization of the dielectric layer 122 may thus be avoided. As such, the dielectric layer 122 is formed before the metallization pattern 126 (see FIG. 9). The patterning forms openings 124 exposing portions of the metallization pattern 116. The patterning may be by an acceptable process, such as by exposing the dielectric layer 122 to light and then developing the dielectric layer 122 after the exposure. As noted above, the photosensitive molding compound includes a photosensitive resin having fillers disposed therein. Patterning the dielectric layer 122 comprises patterning the photosensitive resin. After the photosensitive resin is patterned, it can be removed. The fillers disposed in the patterned portions of the photosensitive resin are also removed. The photosensitive resin can be cured after patterning, which reduces the photosensitivity of the dielectric layer 122.

The photosensitive molding compound of the dielectric layer 122 has a large degree of planarity, such as a degree of planarity of greater than about 90%. However, because planarization of the dielectric layer 122 may be omitted, the dielectric layer 122 may have a lesser degree of planarity than the dielectric layer 114. Further, because the photosensitive molding compound contains fillers, it can have a large surface roughness, such as a surface roughness in the range of about 0.3 µm to about 1 µm. The dielectric layer 122 has a greater surface roughness than the dielectric layer 114.

Figure 8:
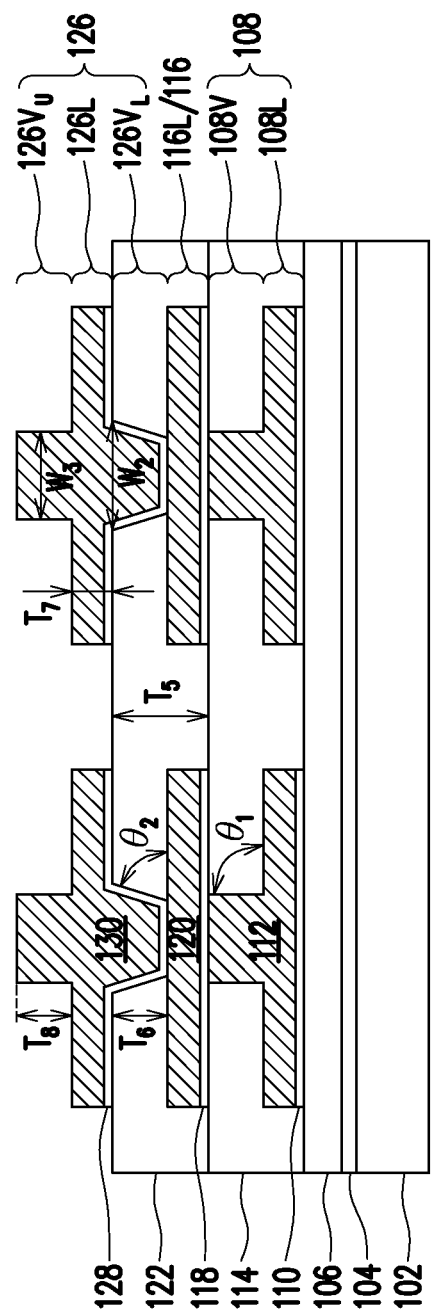

In FIG. 8, the metallization pattern 126 is formed. The metallization pattern 126 includes lower conductive vias $126V_L$ extending through the dielectric layer 122 to physically and electrically couple the metallization pattern 116. The metallization pattern 126 also includes conductive lines 126L on and extending along the major surface of the dielectric layer 122. The metallization pattern 126 further includes upper conductive vias $126V_U$ on the conductive lines 126L. As an example to form the metallization pattern 126, a seed layer 128 is formed over the dielectric layer 122 and in the openings 124 extending through the dielectric layer 122. In some embodiments, the seed layer 128 is a metal layer, which may be a single layer or a composite layer comprising a plurality of sub-layers formed of different materials. In some embodiments, the seed layer 128 comprises a titanium layer and a copper layer over the titanium layer. The seed layer 128 may be formed using, for example, PVD or the like. A first photoresist is then formed and patterned on the seed layer 128. The first photoresist may be formed by spin coating or the like and may be exposed to light for patterning. The pattern of the first photoresist corresponds to the conductive lines 126L and lower conductive vias $126V_L$. The patterning forms openings through the first photoresist to expose the seed layer 128. A conductive material 130 is then formed in the openings of the first photoresist and on the exposed portions of the seed layer 128. The conductive material 130 may be formed by plating, such as electroplating or electroless plating, or the like. The conductive material 130 may comprise a metal, like copper, titanium, tungsten, aluminum, or the like. The first photoresist is then removed, such as by an acceptable ashing or stripping process, such as using an oxygen plasma or the like. A second photoresist is then formed and patterned on the conductive lines 126L. The second photoresist may be formed by spin coating or the like and may be exposed to light for patterning. The pattern of the second photoresist corresponds to the upper conductive vias $126V_U$. The patterning forms openings through the second photoresist to expose the conductive lines 126L. Additional conductive material 130 is then formed in the openings of the second photoresist and on the exposed portions of the conductive lines 126L. The additional conductive material 130 may be formed by plating from the conductive lines 126L, without forming a seed layer on the conductive lines 126L. The combination of the conductive material 130 and underlying portions of the seed layer 128 form the metallization pattern 126. The second photoresist and portions of the seed layer 128 on which the conductive material 130 is not formed are removed. The second photoresist may be removed by an acceptable ashing or stripping process, such as using an oxygen plasma or the like. Once the second photoresist is removed, exposed portions of the seed layer 128 are removed, such as by using an acceptable etching process, such as by wet or dry etching.

The dielectric layer 122 is formed to a small thickness $T_5$, such as a thickness $T_5$ in the range of about 25 μm to about 28 μm. As noted above, the photosensitive molding compound of the dielectric layer 122 has a large Young's Modulus. As such, the photosensitive molding compound offers a large amount of mechanical support even when formed to a small thickness $T_5$. A small thickness $T_5$ may allow the formation of smaller lower conductive vias $126V_L$ and smaller conductive lines 116L and 126L. In particular, the lower conductive vias $126V_L$ may be formed to shorter lengths and smaller dimensions. For example, the lower conductive vias $126V_L$ can be formed to a small thickness $T_6$, such as a thickness $T_6$ in the range of about 18 μm to about 20 μm. Likewise, the lower conductive vias $126V_L$ can be formed to a small width $W_2$, such as a width $W_2$ in the range of about 20 μm to about 40 μm, such as less than about 25 μm. The thickness $T_6$ is less than the thickness $T_3$, and the width $W_2$ is less than the width $W_1$. Features of shorter lengths and smaller dimensions may be desirable for some types of connections, such as data connections. Further, the photosensitive molding compound has a small $D_K$ and $D_F$, which may increase the electrical isolation between the conductive lines 116L and 126L. For example, the photosensitive molding compound can have a $D_K$ of less than 2.8, such as in the range of about 2.3 to about 2.6, and a $D_F$ of less than or equal to about 0.008, such as in the range of about 0.006 to about 0.008. The dielectric layer 122 has a smaller $D_K$ and $D_F$ than the dielectric layer 106. Increasing the electrical isolation between the conductive lines 116L and 126L may improve electrical performance of the data connections, such as by increasing the signal integrity.

The dielectric layer 114 (e.g., the photoinsensitive molding compound) has a larger Young's Modulus and CTE than the dielectric layer 122 (e.g., the photosensitive molding compound). Further, the dielectric layer 114 also has a smaller DK and DF than the dielectric layer 122. In other words, the dielectric layer 114 has better electrical and mechanical performance than the dielectric layer 122. However, the dielectric layer 122 still has sufficient electrical and mechanical performance for low-voltage signals, such as data connections. Further, as discussed above, the dielectric layer 122 can be patterned by photolithography after formation. As such, the dielectric layer 122 can be formed before the metallization pattern 126, and planarization of the dielectric layer 122 may be avoided. The dielectric layer 122 may thus be formed at a lower cost than the dielectric layer 114.

The metallization pattern 126 also has additional dimensions which are illustrated. The conductive lines 126L can be formed to a large thickness $T_7$, such as a thickness $T_7$ in the range of about 7 μm to about 8 μm. In some embodiments, the thickness $T_7$ is the same as the thickness $T_3$. Further, the upper conductive vias $126V_U$ can be formed to a large thickness $T_8$, such as a thickness $T_8$ in the range of about 30 μm to about 32 μm. In some embodiments, the thickness $T_8$ is the same as the thickness $T_4$. Further, the upper conductive vias $126V_U$ can be formed to a large width $W_3$, which can be in the range of about 27 μm to about 33 μm, such as greater than about 30 μm. In some embodiments, the thickness $W_3$ is the same as the thickness $W_1$.

Further, because the metallization patterns 108 and 126 are formed by different techniques, their respective conductive vias 108V and $126V_L$ form different angles with underlying features. Sidewalls of the conductive vias 108V form a first angle $\theta_1$ with a major surface of the conductive line 108L, and sidewalls of the lower conductive via $126V_L$ form a second angle $\theta_2$ with a major surface of the conductive line 116L. For example, the angle $\theta_1$ can be in the range of about 80 degrees to about 90 degrees, and the angle $\theta_2$ can be in the range of about 60 degrees to about 70 degrees. The first angle $\theta_1$ is greater than the second angle $\theta_2$.

Figure 9:
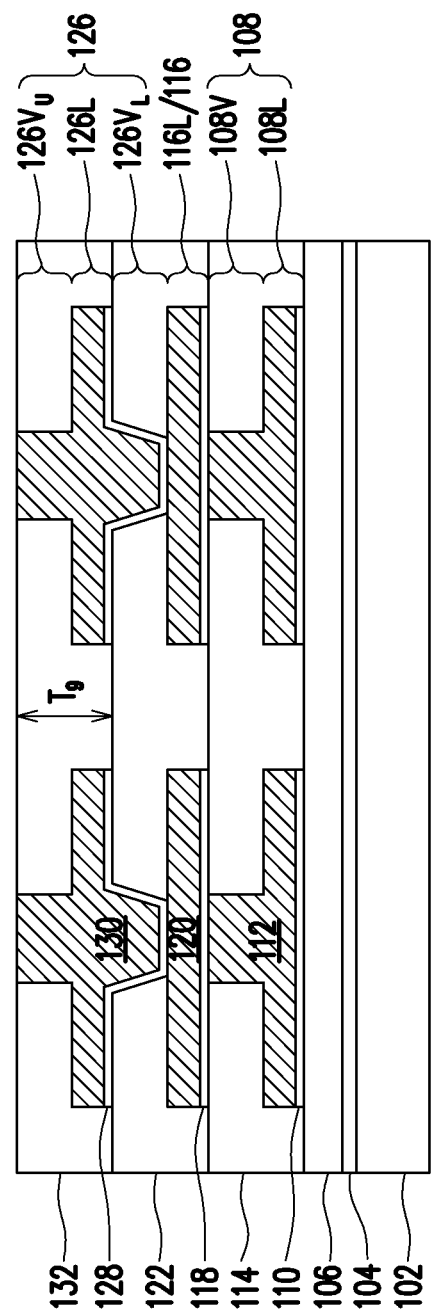

In FIG. 9, the dielectric layer 132 is formed around the metallization pattern 126 and on the dielectric layer 122. After formation, the dielectric layer 132 surrounds the metallization pattern 126. The dielectric layer 132 may be formed of a similar material and in a similar manner as the dielectric layer 114. Similar to the dielectric layer 114, the dielectric layer 132 is formed over the metallization pattern 126 such that the metallization pattern 126 is buried or covered, and a planarization process is then performed on the dielectric layer 132 to expose the upper conductive vias $126V_U$. Topmost surfaces of the dielectric layer 132 and upper conductive vias $126V_U$ are planar after the planarization process. The planarization process may be, for example, a chemical-mechanical polish (CMP). After formation, the dielectric layer 132 has a thickness $T_9$, such as a thickness $T_9$ in the range of about 37 μm to about 40 μm. In some embodiments, the thickness $T_9$ is the same as the thickness $T_2$.

Figure 10:
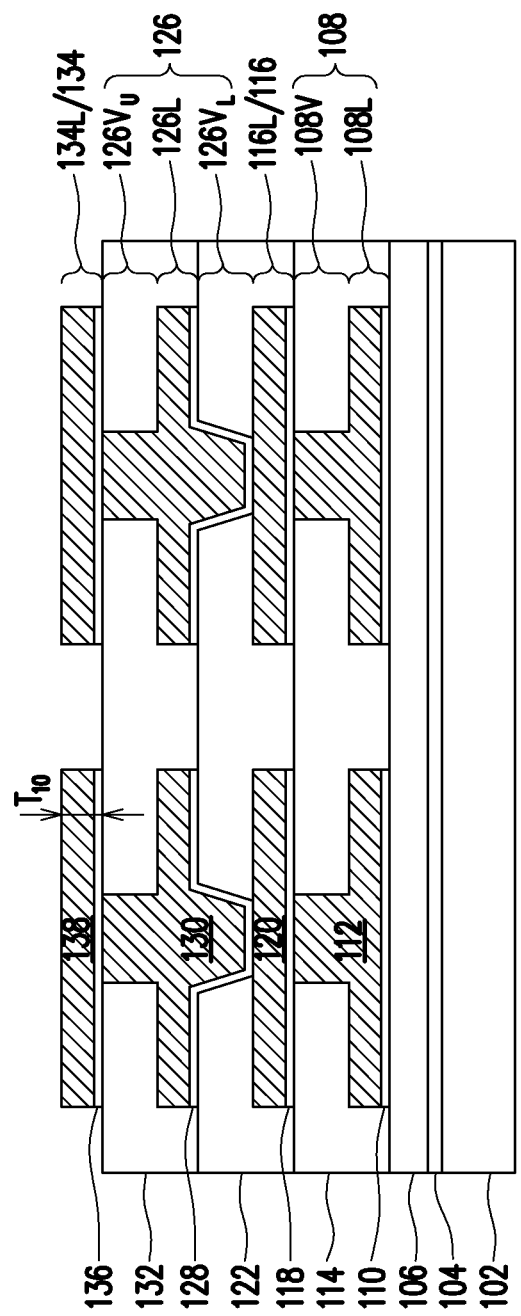

In FIG. 10, the metallization pattern 134 is formed on the dielectric layer 132 and exposed portions of the upper conductive vias $126V_U$. The metallization pattern 134 only includes conductive lines 134L, and does not have conductive vias. The metallization pattern 134 may be formed of a similar material and in a similar manner as the metallization pattern 116. For example, the metallization pattern 134 can comprise a seed layer 136 and a conductive material 138 on the seed layer 136. After formation, the metallization pattern 134 has a thickness $T_{10}$, such as a thickness $T_{10}$ in the range of about 7 μm to about 8 μm. In some embodiments, the thickness $T_{10}$ is the same as the thickness $T_3$.

Figure 11:
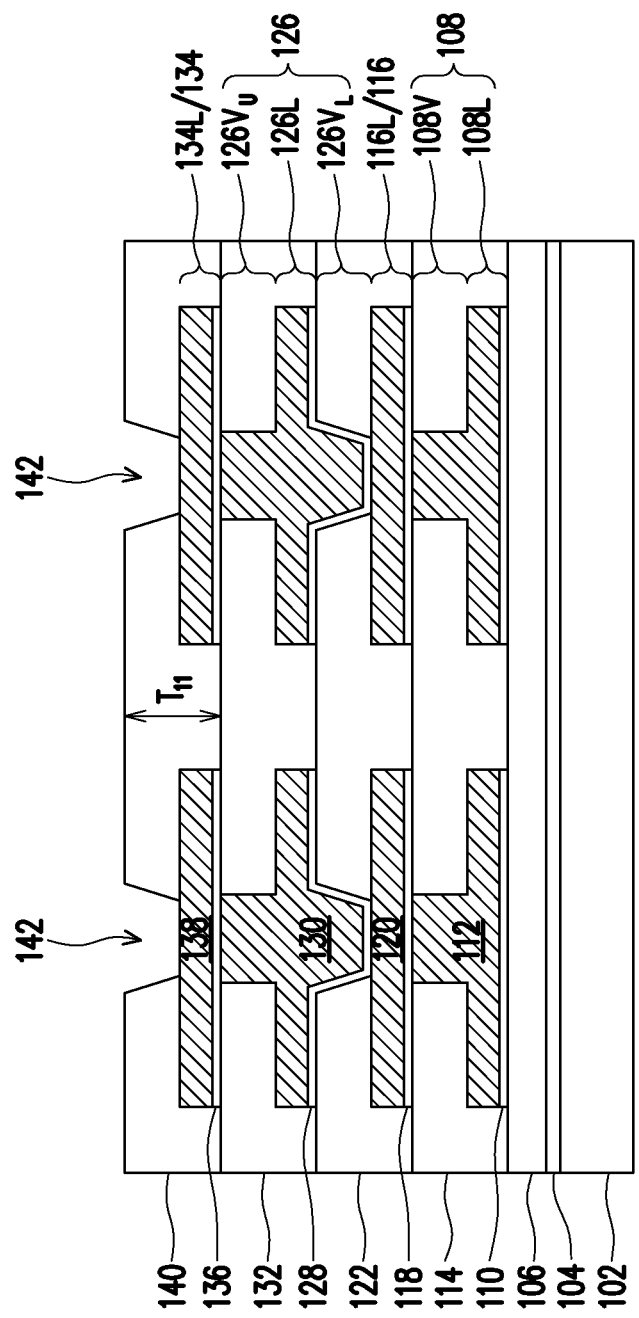

In FIG. 11, the dielectric layer 140 is formed around the metallization pattern 134 and on the dielectric layer 132. The dielectric layer 140 may be formed of a similar material and in a similar manner as the dielectric layer 122. The dielectric layer 140 is then patterned. The patterning forms openings 142 exposing portions of the metallization pattern 134. The patterning may be by a similar process as the process for patterning the dielectric layer 122. After formation, the dielectric layer 140 has a thickness $T_{11}$, such as a thickness $T_{11}$ in the range of about 25 μm to about 28 μm. In some embodiments, the thickness $T_{11}$ is the same as the thickness $T_5$.

Figure 12:
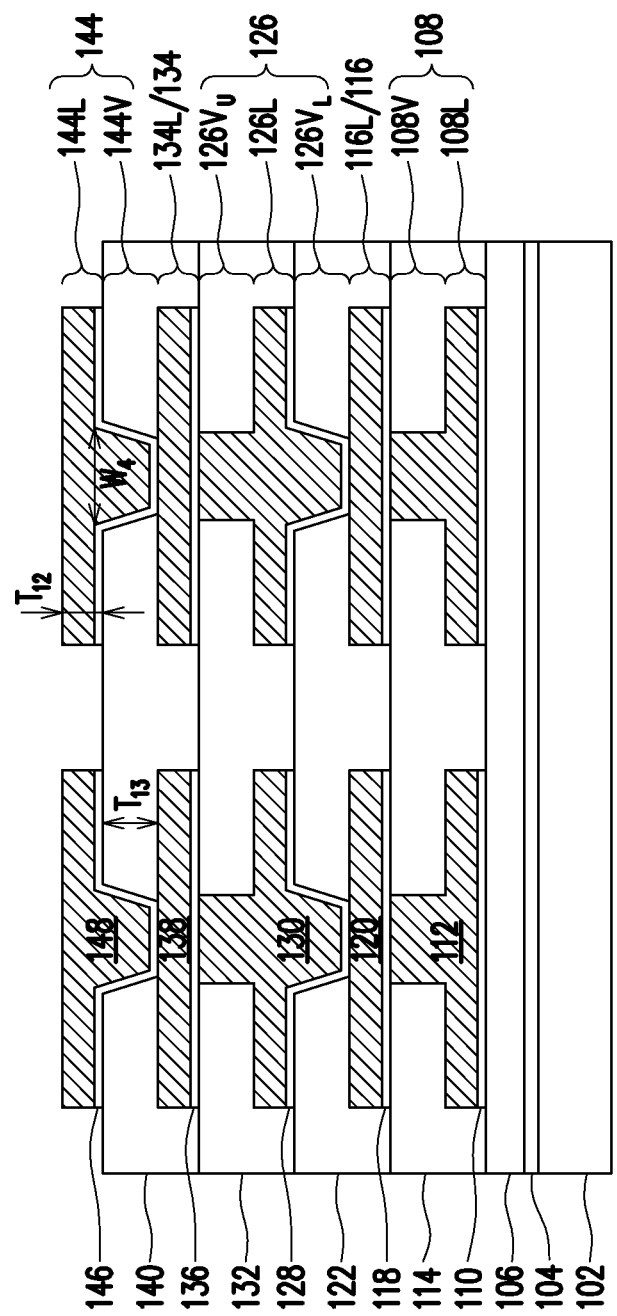

In FIG. 12, the metallization pattern 144 is formed on the dielectric layer 140 and exposed portions of the metallization pattern 134. The metallization pattern 144 includes conductive vias 144V extending through the dielectric layer 140 to physically and electrically couple the metallization pattern 134. The metallization pattern 144 also includes conductive lines 144L on and extending along the major surface of the dielectric layer 140. As an example to form the metallization pattern 144, a seed layer 146 is formed over the dielectric layer 140 and in the openings 142 extending through the dielectric layer 140. In some embodiments, the seed layer 146 is a metal layer, which may be a single layer or a composite layer comprising a plurality of sub-layers formed of different materials. In some embodiments, the seed layer 146 comprises a titanium layer and a copper layer over the titanium layer. The seed layer 146 may be formed using, for example, PVD or the like. A photoresist is then formed and patterned on the seed layer 146. The photoresist may be formed by spin coating or the like and may be exposed to light for patterning. The pattern of the photoresist corresponds to the conductive lines 144L and conductive vias 144V. The patterning forms openings through the photoresist to expose the seed layer 146. A conductive material 148 is then formed in the openings of the photoresist and on the exposed portions of the seed layer 146. The conductive material 148 may be formed by plating, such as electroplating or electroless plating, or the like. The conductive material 148 may comprise a metal, like copper, titanium, tungsten, aluminum, or the like. The combination of the conductive material 148 and underlying portions of the seed layer 146 form the metallization pattern 144. The photoresist and portions of the seed layer 146 on which the conductive material 148 is not formed are removed. The photoresist may be removed by an acceptable ashing or stripping process, such as using an oxygen plasma or the like. Once the photoresist is removed, exposed portions of the seed layer 146 are removed, such as by using an acceptable etching process, such as by wet or dry etching. After formation, the conductive lines 144L have a thickness $T_{12}$, such as a thickness $T_{12}$ in the range of about 7 μm to about 8 μm. In some embodiments, the thickness $T_{12}$ is the same as the thickness $T_3$. Further, the conductive vias 144V have a thickness $T_{13}$, such as a thickness $T_{13}$ in the range of about 18 μm to about 20 μm. In some embodiments, the thickness $T_{13}$ is the same as the thickness $T_6$. Further, the conductive vias 144V have a width $W_4$, which can be in the range of about 20 μm to about 40 μm, such as less than about 25 μm. In some embodiments, the width $W_4$ is the same as the width $W_2$.

Figure 13:
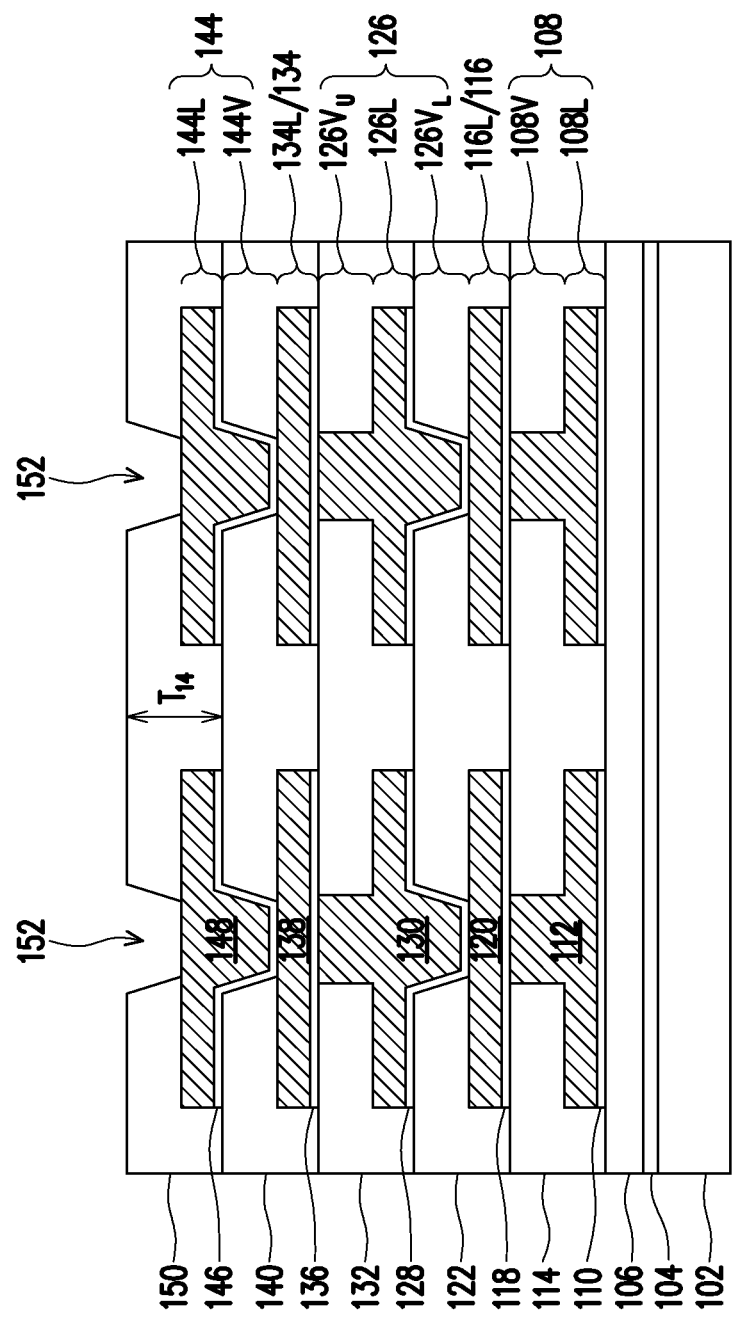

In FIG. 13, the dielectric layer 150 is formed around the metallization pattern 144 and on the dielectric layer 140. The dielectric layer 150 may be formed of a similar material and in a similar manner as the dielectric layer 122. The dielectric layer 150 is then patterned. The patterning forms openings 152 exposing portions of the metallization pattern 144. The patterning may be by a similar process as the process for patterning the dielectric layer 122. After formation, the dielectric layer 150 has a thickness $T_{14}$, such as a thickness $T_{14}$ in the range of about 25 μm to about 28 μm. In some embodiments, the thickness $T_{14}$ is the same as the thickness $T_5$.

Figure 14:
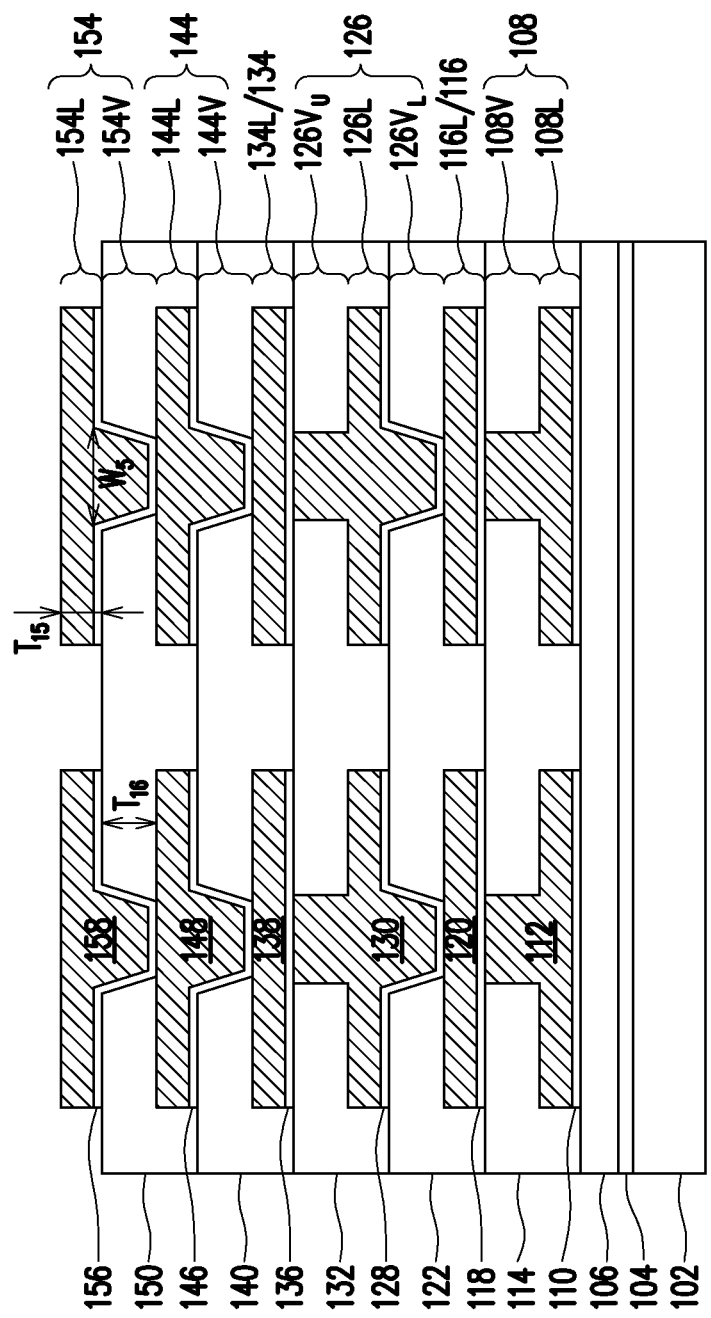

In FIG. 14, the metallization pattern 154 is formed on the dielectric layer 150 and the portions of the metallization pattern 144 exposed by the openings 152. The metallization pattern 154 includes conductive vias 154V extending through the dielectric layer 150 to physically and electrically couple the metallization pattern 134. The metallization pattern 154 also includes conductive lines 154L on and extending along the major surface of the dielectric layer 150. The metallization pattern 154 may be formed of a similar material and in a similar manner as the metallization pattern 144. For example, the metallization pattern 154 can comprise a seed layer 156 and a conductive material 158 on the seed layer 156. After formation, the conductive lines 154L have a thickness $T_{15}$, such as a thickness $T_{15}$ in the range of about 7 μm to about 8 μm. In some embodiments, the thickness $T_{15}$ is the same as the thickness $T_3$. Further, the conductive vias 154V have a thickness $T_{16}$, such as a thickness $T_{16}$ in the range of about 18 μm to about 20 μm. In some embodiments, the thickness $T_{16}$ is the same as the thickness $T_6$. Further, the conductive vias 154V have a width $W_5$, which can be in the range of about 20 μm to about 40 μm, such as less than about 25 μm. In some embodiments, the width $W_5$ is the same as the width $W_2$.

Figure 15:
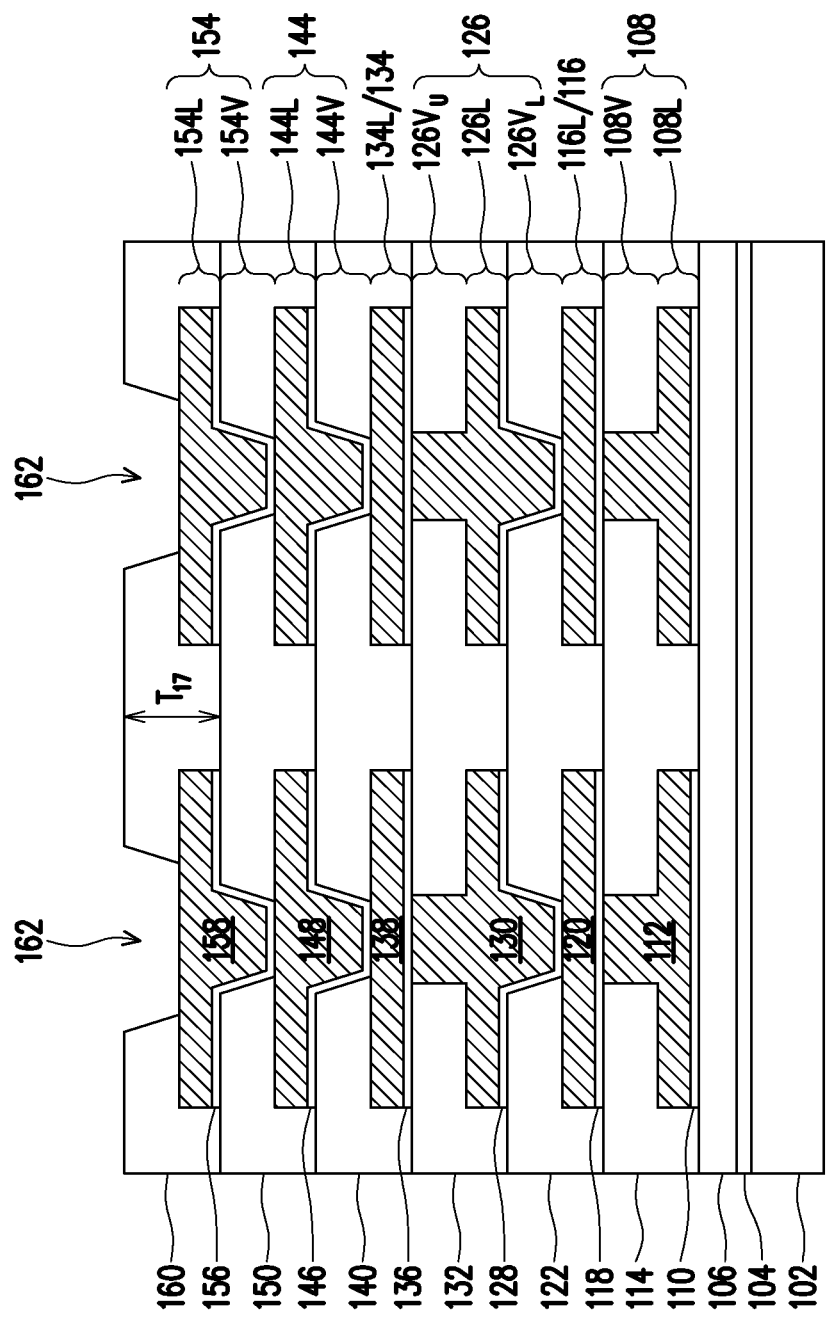

In FIG. 15, the dielectric layer 160 is formed around the metallization pattern 154 and on the dielectric layer 150. The dielectric layer 160 may be formed of a similar material and in a similar manner as the dielectric layer 122. The dielectric layer 160 is then patterned. The patterning forms openings 162 exposing portions of the metallization pattern 154. The patterning may be by a similar process as the process for patterning the dielectric layer 122. After formation, the dielectric layer 160 has a thickness $T_{17}$, such as a thickness $T_{17}$ in the range of about 25 μm to about 28 μm. In some embodiments, the thickness $T_{17}$ is the same as the thickness $T_5$.

Figure 16:
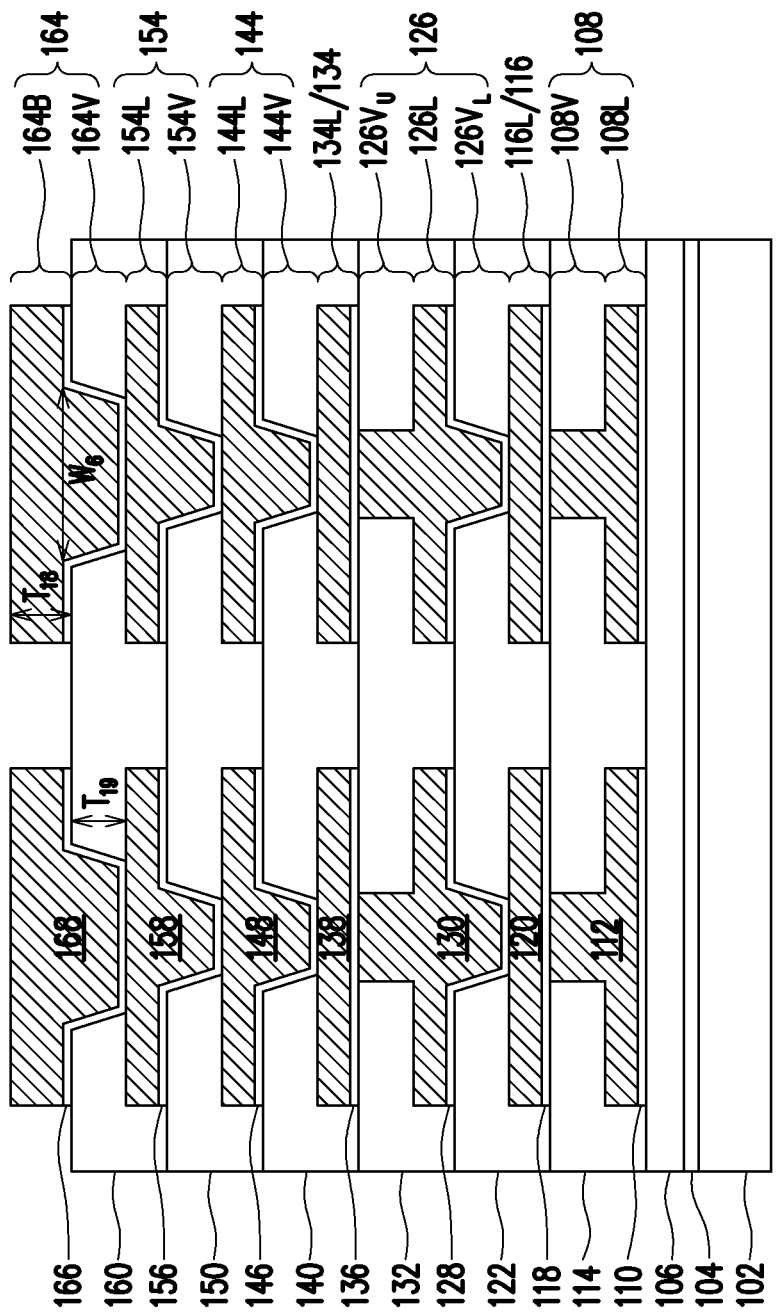

In FIG. 16, the UBMs 164 are formed for external connection to the redistribution structure 52. The UBMs 164 include conductive vias 164V extending through the dielectric layer 160 to physically and electrically couple the metallization pattern 154. The UBMs 164 also include bumps 164B on and extending along the major surface of the dielectric layer 160. The UBMs 164 may be formed of a similar material and in a similar manner as the metallization pattern 144. For example, the UBMs 164 can comprise a seed layer 166 and a conductive material 168 on the seed layer 166. After formation, the bumps 164B have a thickness $T_{18}$, such as a thickness $T_{18}$ in the range of about 8 μm to about 10 μm. Further, the conductive vias 164V have a thickness $T_{19}$, such as a thickness $T_{19}$ in the range of about 18 μm to about 20 μm. Further, the conductive vias 154V have a width $W_6$, which can be in the range of about 140 μm to about 160 μm, such as greater than about 150 μm.

Figure 17:
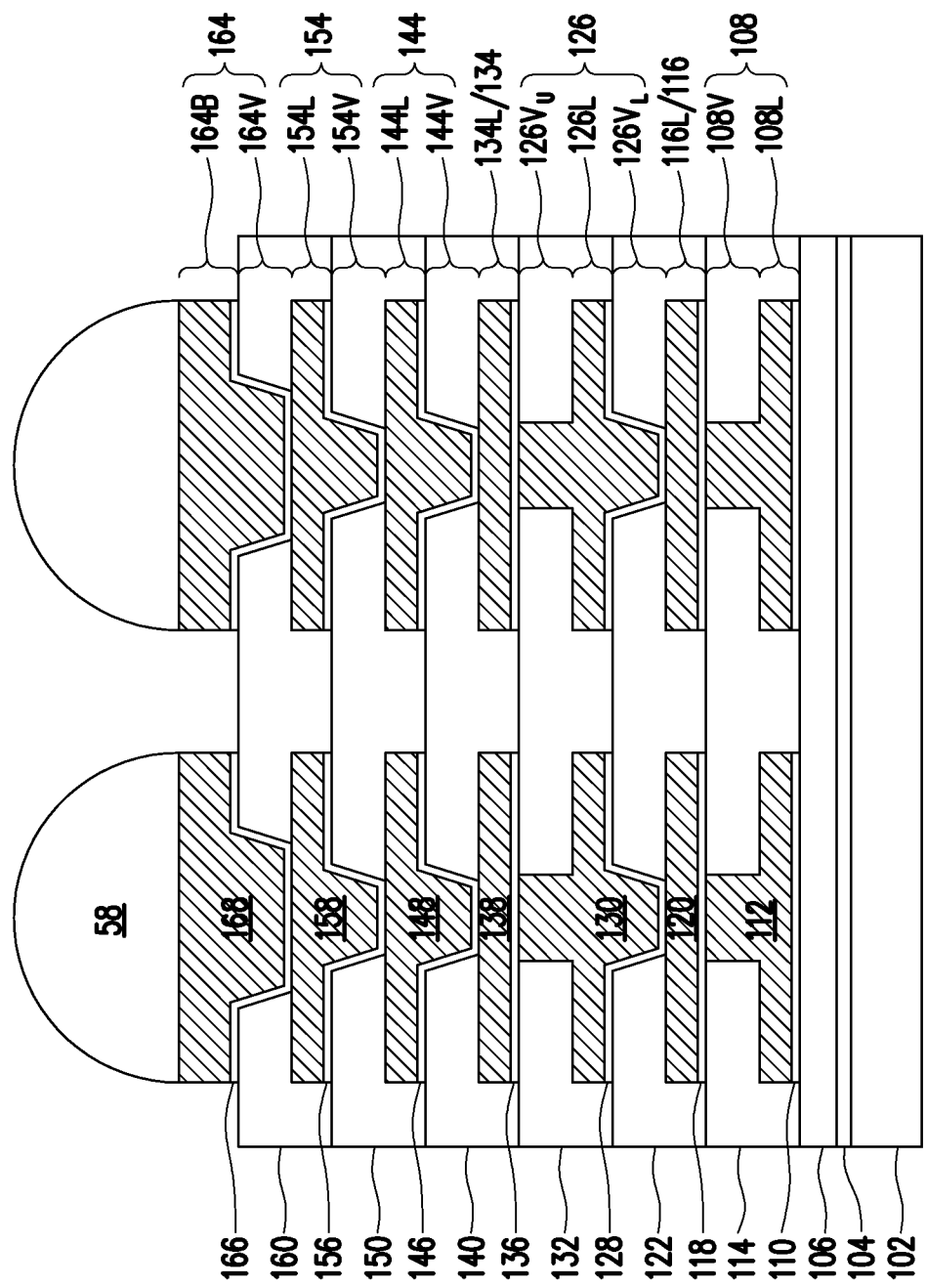

In FIG. 17, the conductive connectors 58 are formed on the UBMs 164. The conductive connectors 58 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 58 may include a conductive material such as solder, copper, aluminum, gold, nickel, silver, palladium, tin, the like, or a combination thereof. In some embodiments, the conductive connectors 58 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 58 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 18:
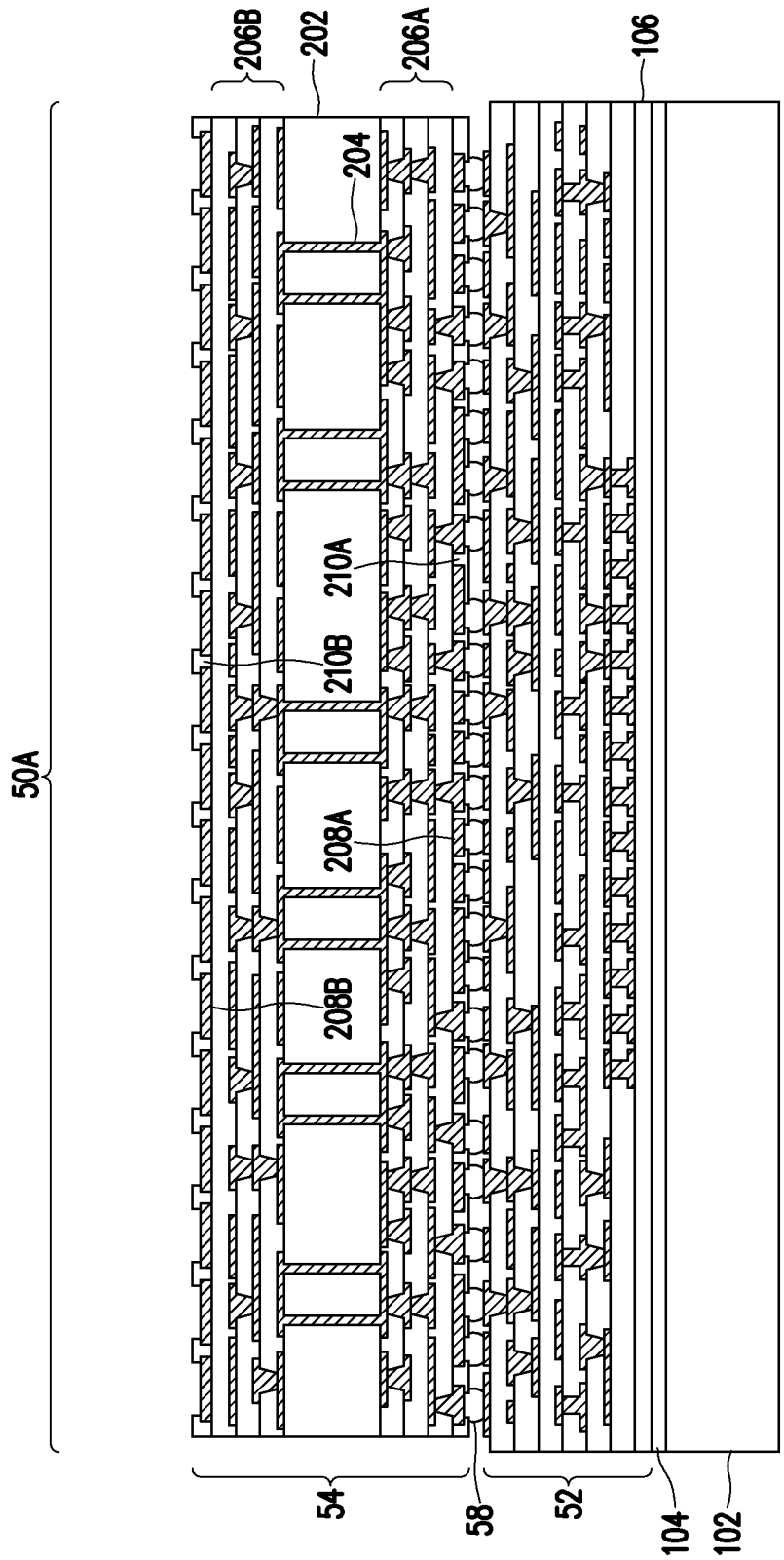

In FIG. 18, the interposer 54 is attached to the redistribution structure 52. The interposer 54 may be, e.g., an organic substrate, a ceramic substrate, a silicon substrate, or the like. The conductive connectors 58 are used to attach the interposer 54 to the redistribution structure 52. Attaching the interposer 54 may include placing the interposer 54 on the conductive connectors 58 and reflowing the conductive connectors 58 to physically and electrically couple the interposer 54 to the redistribution structure 52.

Before being attached, to the redistribution structure 52 the interposer 54 may be processed according to applicable manufacturing processes to form redistribution structures in the interposer 54. For example, the interposer 54 includes a substrate core 202. The substrate core 202 may be formed of glass fiber, resin, filler, other materials, and/or combinations thereof. The substrate core 202 may be formed of organic and/or inorganic materials. In some embodiments, the substrate core 202 includes one or more passive components (not shown) embedded inside. Alternatively, the substrate core 202 may comprise other materials or components. Conductive vias 204 are formed extending through the substrate core 202. The conductive vias 204 comprise a conductive material such as copper, a copper alloy, or other conductors, and may include a barrier layer, liner, seed layer, and/or a fill material, in some embodiments. The conductive vias 204 provide vertical electrical connections from one side of the substrate core 202 to the other side of the substrate core 202. For example, some of the conductive vias 204 are coupled between conductive features at one side of the substrate core 202 and conductive features at an opposite side of the substrate core 202. Holes for the conductive vias 204 may be formed using a drilling process, photolithography techniques, a laser process, or other methods, as examples, and the holes of the conductive vias 204 are then filled with conductive material. In some embodiments, the conductive vias 204 are hollow conductive through vias having centers that are filled with an insulating material. Redistribution structures 206A and 206B are formed on opposing sides of the substrate core 202. The redistribution structures 206A and 206B are electrically coupled by the conductive vias 204, and fan-out electrical signals. The redistribution structures 206A and 206B each include dielectric layers and metallization patterns. Each respective metallization pattern has line portions on and extend along the major surface of a respective dielectric layer, and has via portions extending through the respective dielectric layer. The redistribution structures 206A and 206B each, respectively, include UBMs 208A and 208B for external connection, and solder resists 210A and 210B protecting the features of the redistribution structures 206A and 206B. The redistribution structure 206A is attached to the redistribution structure 52 by the UBMs 208A.

Figure 19:
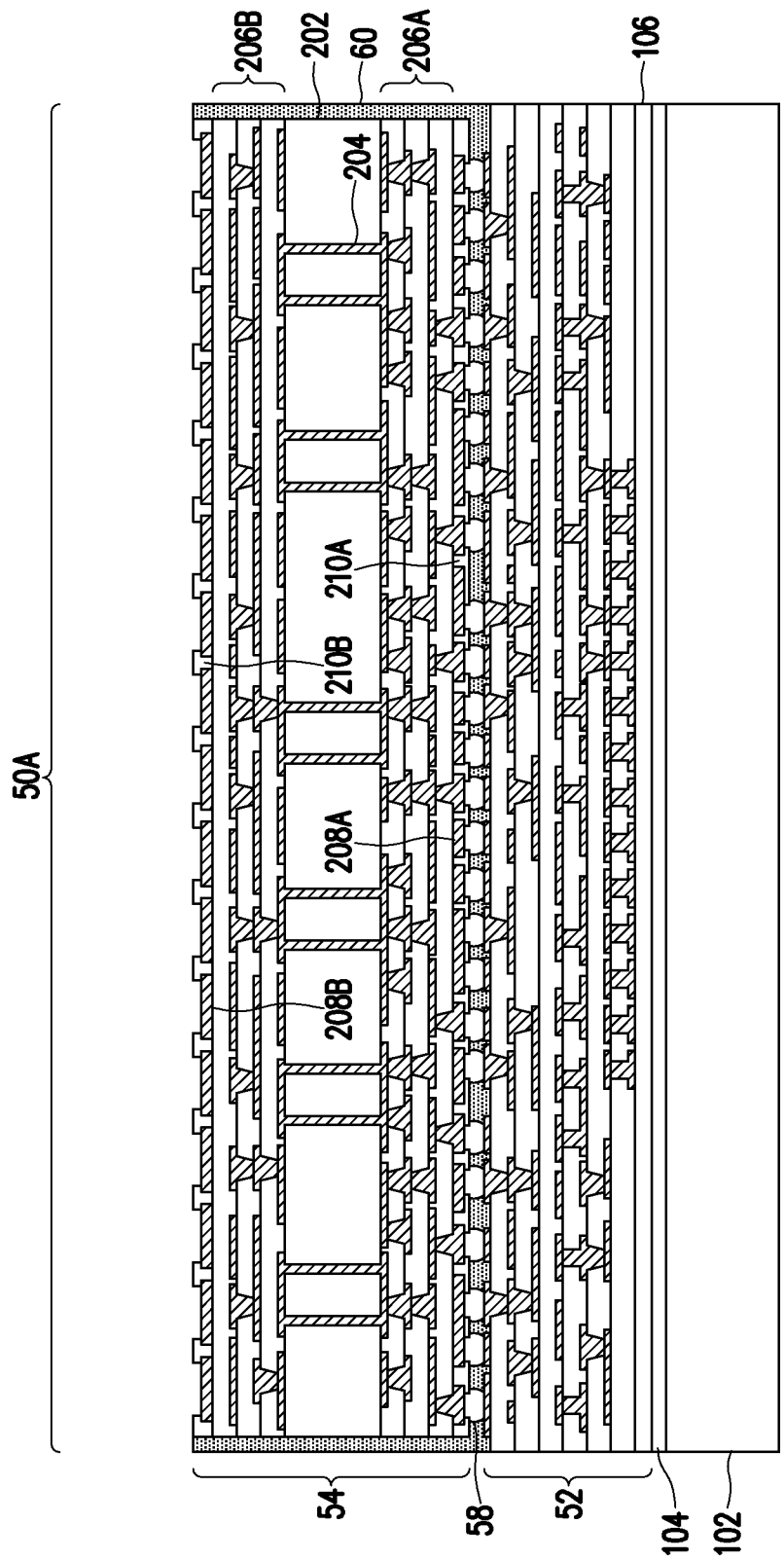

In FIG. 19, an underfill 60 may be formed surrounding the conductive connectors 58. The underfill 60 may reduce stress and protect the joints resulting from the reflowing of the conductive connectors 58. The underfill 60 may be formed by a capillary flow process after the interposer 54 is attached to the redistribution structure 52, or may be formed by a suitable deposition method before the interposer 54 is attached to the redistribution structure 52. The underfill 60 may be formed along sidewalls of the interposer 54.

Figure 20:
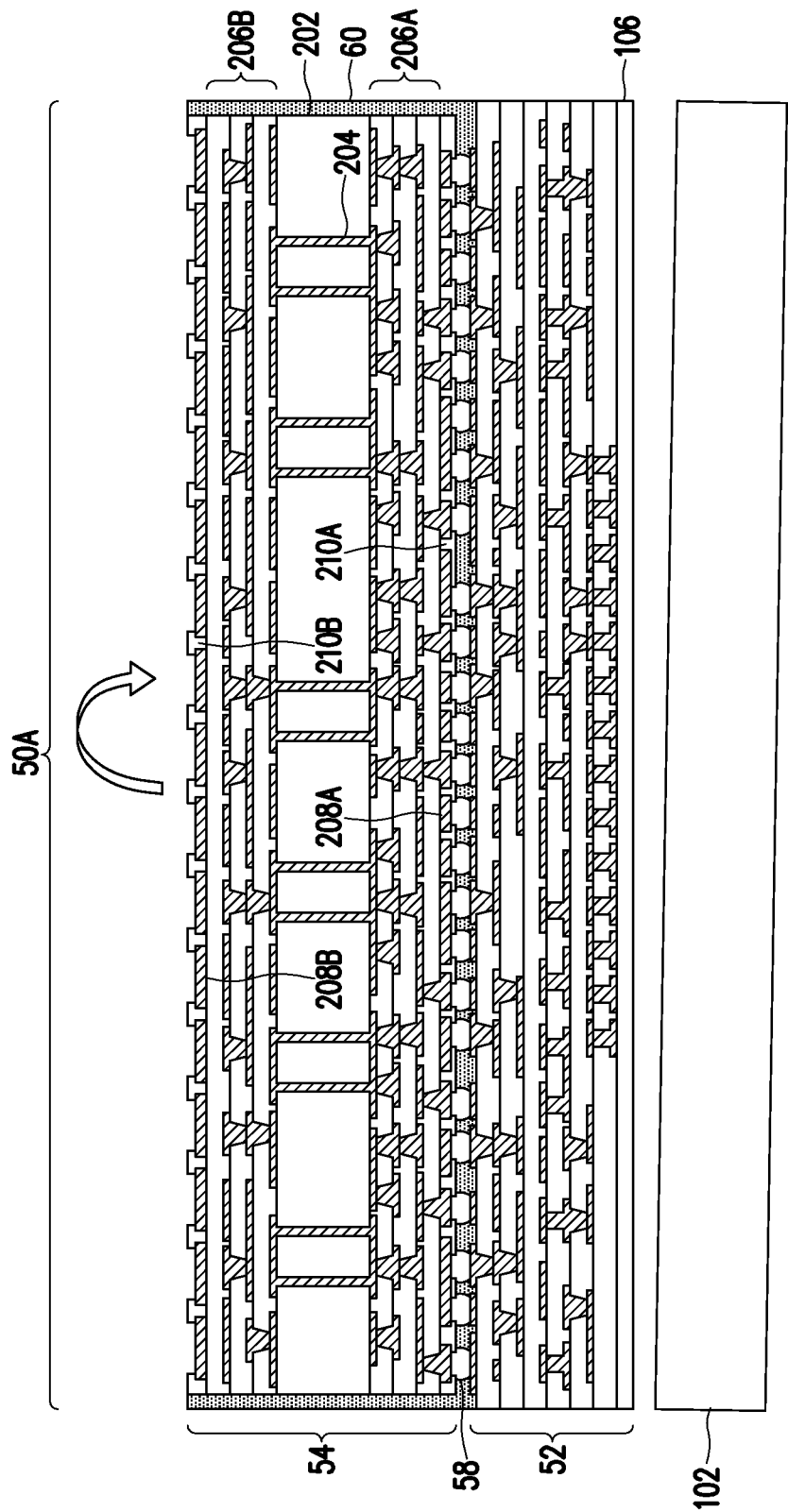

In FIG. 20, a carrier substrate de-bonding is performed to detach (or "de-bond") the carrier substrate 102 from the redistribution structure 52, e.g., from the dielectric layer 106. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape.

Figure 21:
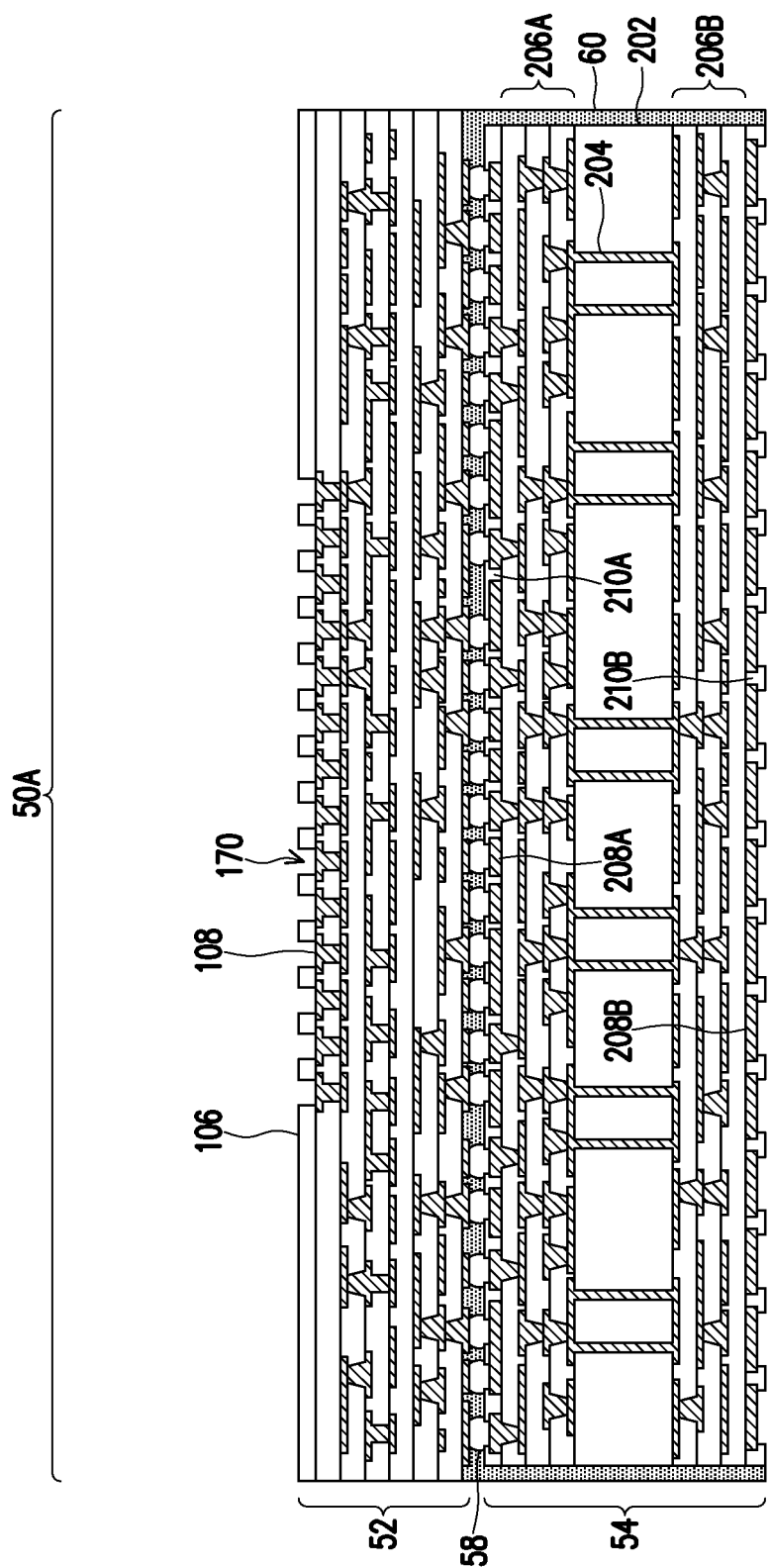

In FIG. 21, openings 170 are formed in the dielectric layer 106, exposing the metallization pattern 108. The openings 170 may be formed by a drilling process such as laser drilling, mechanical drilling, or the like.

Figure 22:
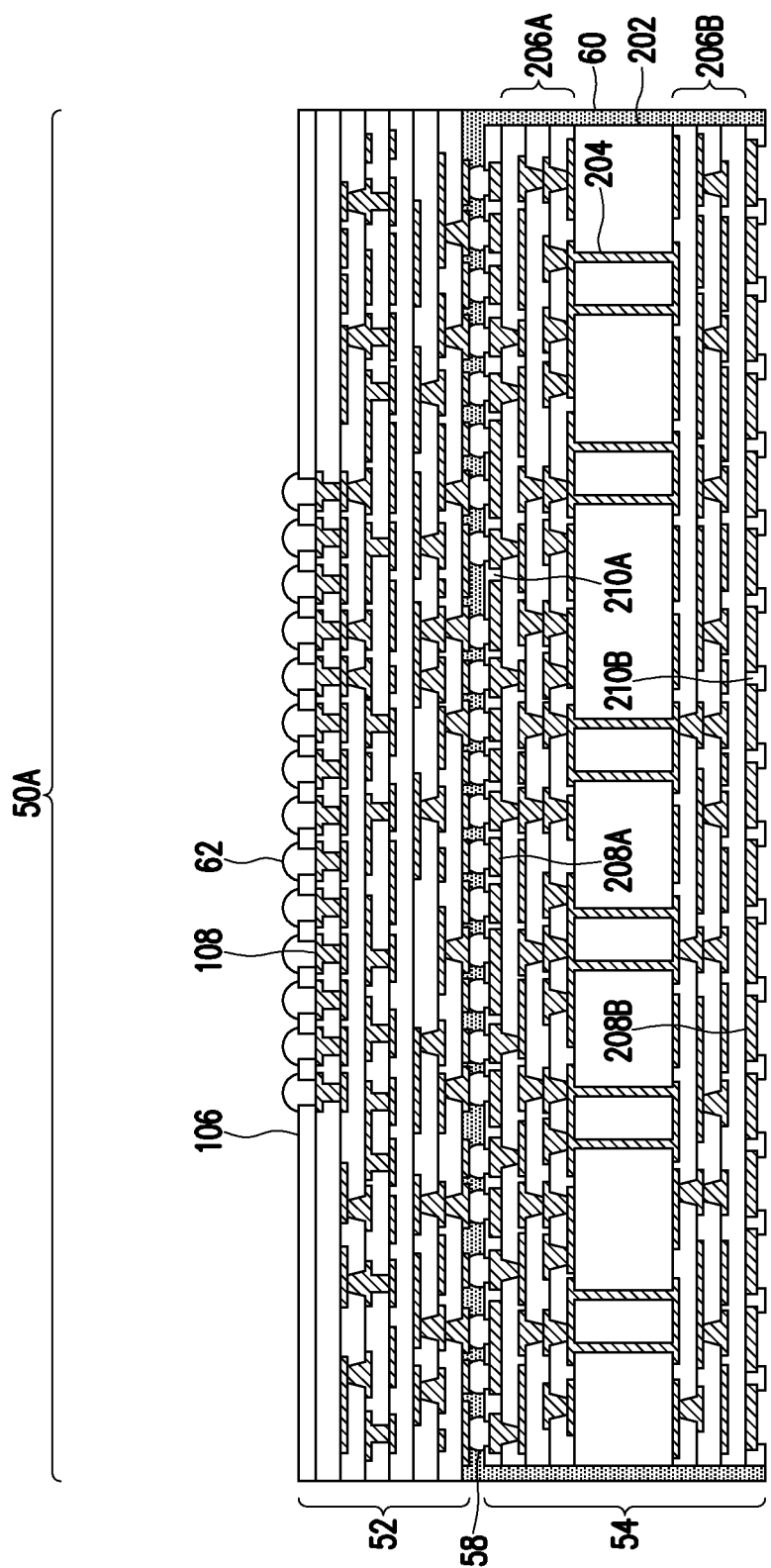

In FIG. 22, the conductive connectors 62 are formed in the openings 170, physically and electrically coupled to the exposed metallization pattern 108. The conductive connectors 62 may be ball grid array (BGA) connectors, solder balls, metal pillars, controlled collapse chip connection (C4) bumps, micro bumps, or the like. The conductive connectors 62 may include a conductive material such as solder, copper, aluminum, gold, nickel, silver, palladium, tin, the like, or a combination thereof. In some embodiments, the conductive connectors 62 are formed by initially forming a layer of reflowable material in the openings 170 through evaporation, electroplating, printing, solder transfer, ball placement, or the like. Once a layer of reflowable material has been formed in the openings 170, a reflow may be performed in order to shape the material into the desired bump shapes.

Figure 23:
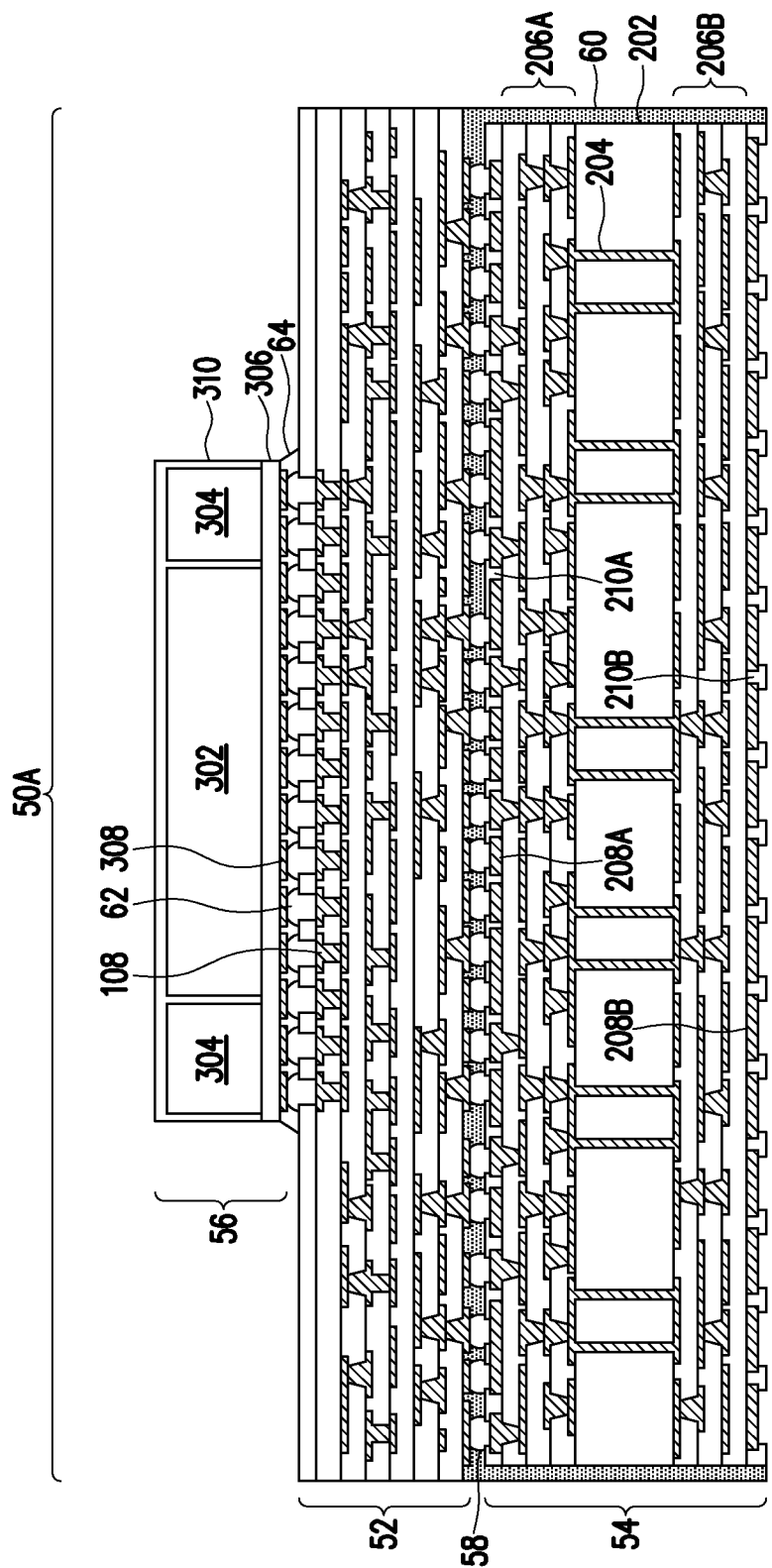

In FIG. 23, the semiconductor device 56 is attached to the redistribution structure 52, opposite the interposer 54. In some embodiments, the semiconductor device 56 is a package that includes one or more integrated circuit dies for forming a computing system. In the embodiment shown, the semiconductor device 56 includes a logic die 302 and memory devices 304. The logic die 302 may be, e.g., a central processing unit (CPU), graphics processing unit (GPU), system-on-a-chip (SoC), application processor (AP), microcontroller, or the like. The memory devices 304 may be, e.g., dynamic random access memory (DRAM) dies, static random access memory (SRAM) dies, hybrid memory cube (HMC) devices, high bandwidth memory (HBM) devices, or the like. The logic die 302 and memory devices 304 are attached to and interconnected by a redistribution structure 306. The redistribution structure 306 may be, e.g., an interposer or the like, and has connectors 308 for external connection. An encapsulant 310 may be formed over the redistribution structure 306 and around the logic die 302 and memory devices 304, thereby protecting the various components of the semiconductor device 56.

The conductive connectors 62 are used to attach the connectors 308 of the semiconductor device 56 to the metallization pattern 108 of the redistribution structure 52. Attaching the semiconductor device 56 may include placing the semiconductor device 56 on the conductive connectors 62 and reflowing the conductive connectors 62 to physically and electrically couple the semiconductor device 56 to the redistribution structure 52.

In some embodiments, an underfill 64 is formed surrounding the conductive connectors 62. The underfill 64 may reduce stress and protect the joints resulting from the reflowing of the conductive connectors 62. The underfill 64 may be formed by a capillary flow process after the semiconductor device 56 is attached to the redistribution structure 52, or may be formed by a suitable deposition method before the semiconductor device 56 is attached to the redistribution structure 52.

Figure 24:
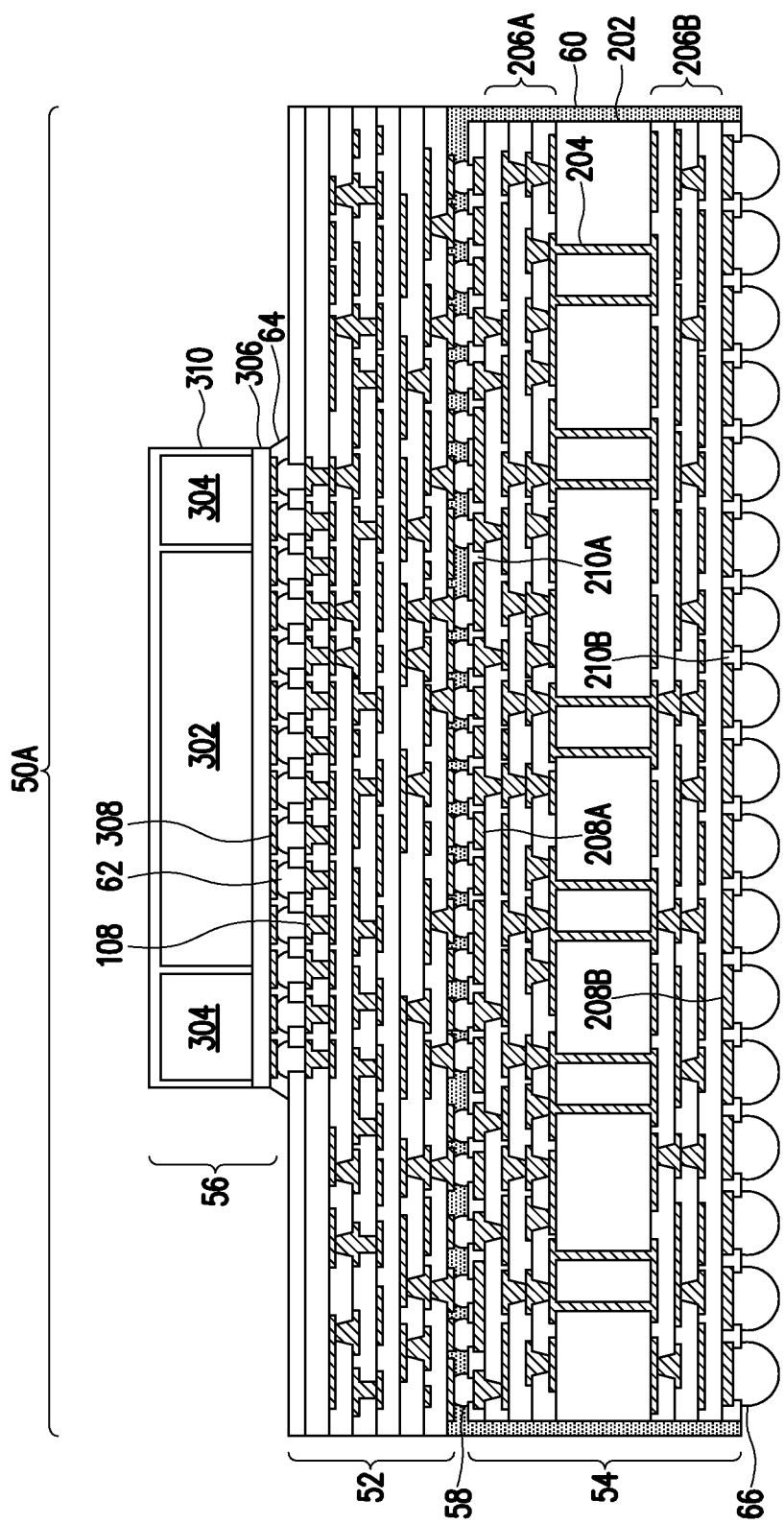

In FIG. 24, the external connectors 66 are formed on the UBMs 208B. The external connectors 66 may be ball grid array (BGA) connectors, solder balls, metal pillars, controlled collapse chip connection (C4) bumps, micro bumps, or the like. The external connectors 66 may include a conductive material such as solder, copper, aluminum, gold, nickel, silver, palladium, tin, the like, or a combination thereof. In some embodiments, the external connectors 66 are formed by initially forming a layer of reflowable material on the UBMs 208B through evaporation, electroplating, printing, solder transfer, ball placement, or the like. Once a layer of reflowable material has been formed on the UBMs 208B, a reflow may be performed in order to shape the material into the desired bump shapes.

In FIG. 25, a singulation process is performed by sawing along scribe line regions, e.g., around the first package region 50A. The sawing singulates the first package region 50A from adjacent package regions. The resulting, singulated package component 50 is from the first package region 50A.

Figure 26:
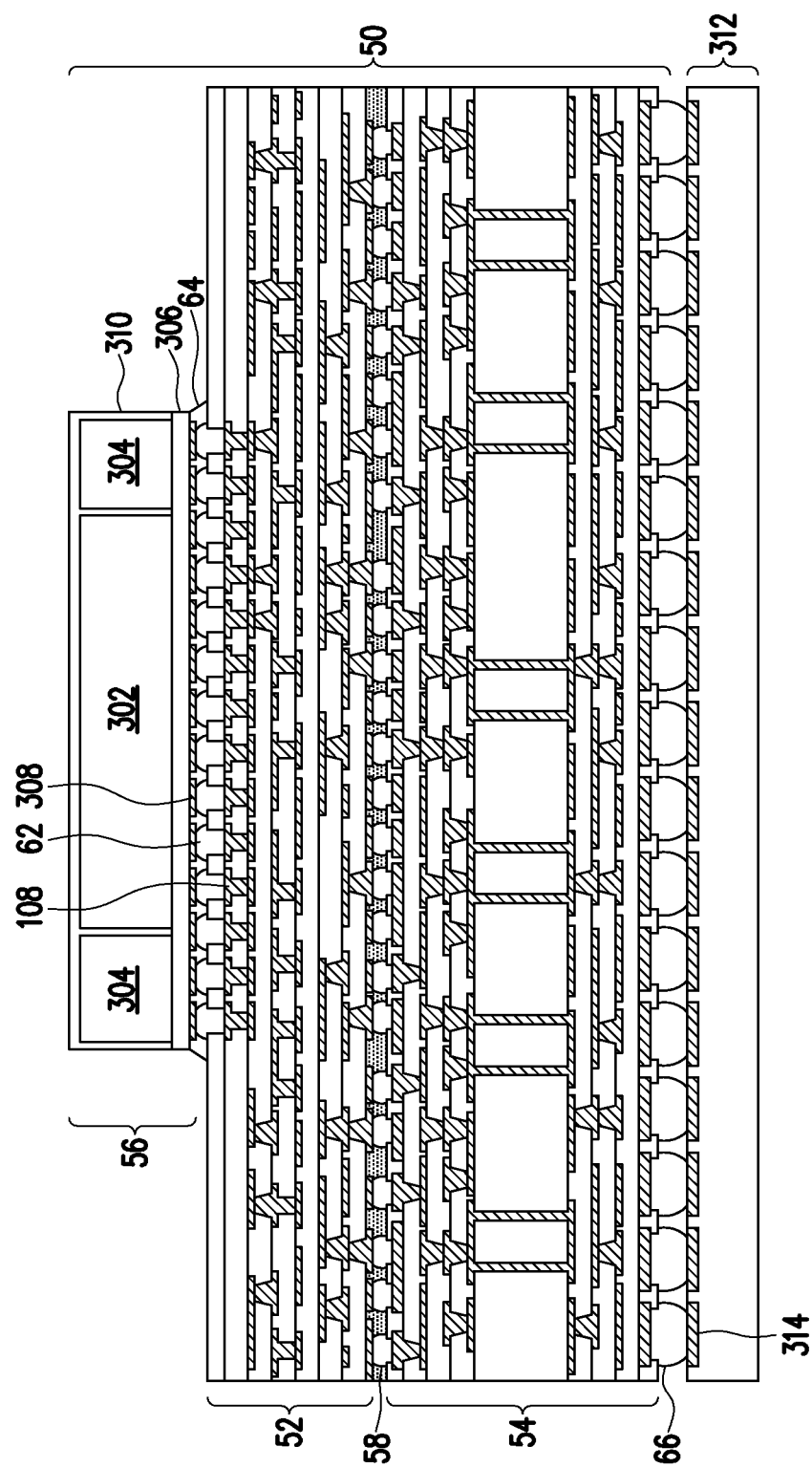
FIG. 26 illustrates a system including a package component, in accordance with some embodiments.

FIG. 26 illustrates a system including a package component 50, in accordance with some embodiments. In this embodiment, the package component 50 is mounted to a package substrate 312 using the external connectors 66. The package substrate 312 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 312 may be a SOI substrate. Generally, an SOI substrate includes a layer of a semiconductor material such as epitaxial silicon, germanium, silicon germanium, SOI, SGOI, or combinations thereof. The package substrate 312 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 312.

The package substrate 312 may include active and passive devices (not shown). As one of ordinary skill in the art will recognize, a wide variety of devices such as transistors, capacitors, resistors, combinations of these, and the like may be used to generate the structural and functional requirements of the design for the device stack. The devices may be formed using any suitable methods.

The package substrate 312 may also include metallization layers and vias (not shown) and bond pads 314 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 312 is substantially free of active and passive devices.

In some embodiments, the external connectors 66 are reflowed to attach the package component 50 to the bond pads 314. The external connectors 66 electrically and/or physically couple the package substrate 312, including metallization layers in the package substrate 312, to the package component 50. In some embodiments, passive devices (e.g., surface mount devices (SMDs), not illustrated) may be attached to the package component 50 (e.g., bonded to the bond pads 314) prior to mounting on the package substrate 312. In such embodiments, the passive devices may be bonded to a same surface of the package component 50 as the external connectors 66.

The external connectors 66 may have an epoxy flux (not shown) formed thereon before they are reflowed with at least some of the epoxy portion of the epoxy flux remaining after the package component 50 is attached to the package substrate 312. This remaining epoxy portion may act as an underfill to reduce stress and protect the joints resulting from the reflowing the external connectors 66. In some embodiments, an underfill (not shown) may be formed between the package component 50 and the package substrate 312, surrounding the external connectors 66. The underfill may be formed by a capillary flow process after the package component 50 is attached or may be formed by a suitable deposition method before the package component 50 is attached.

Figure 27:
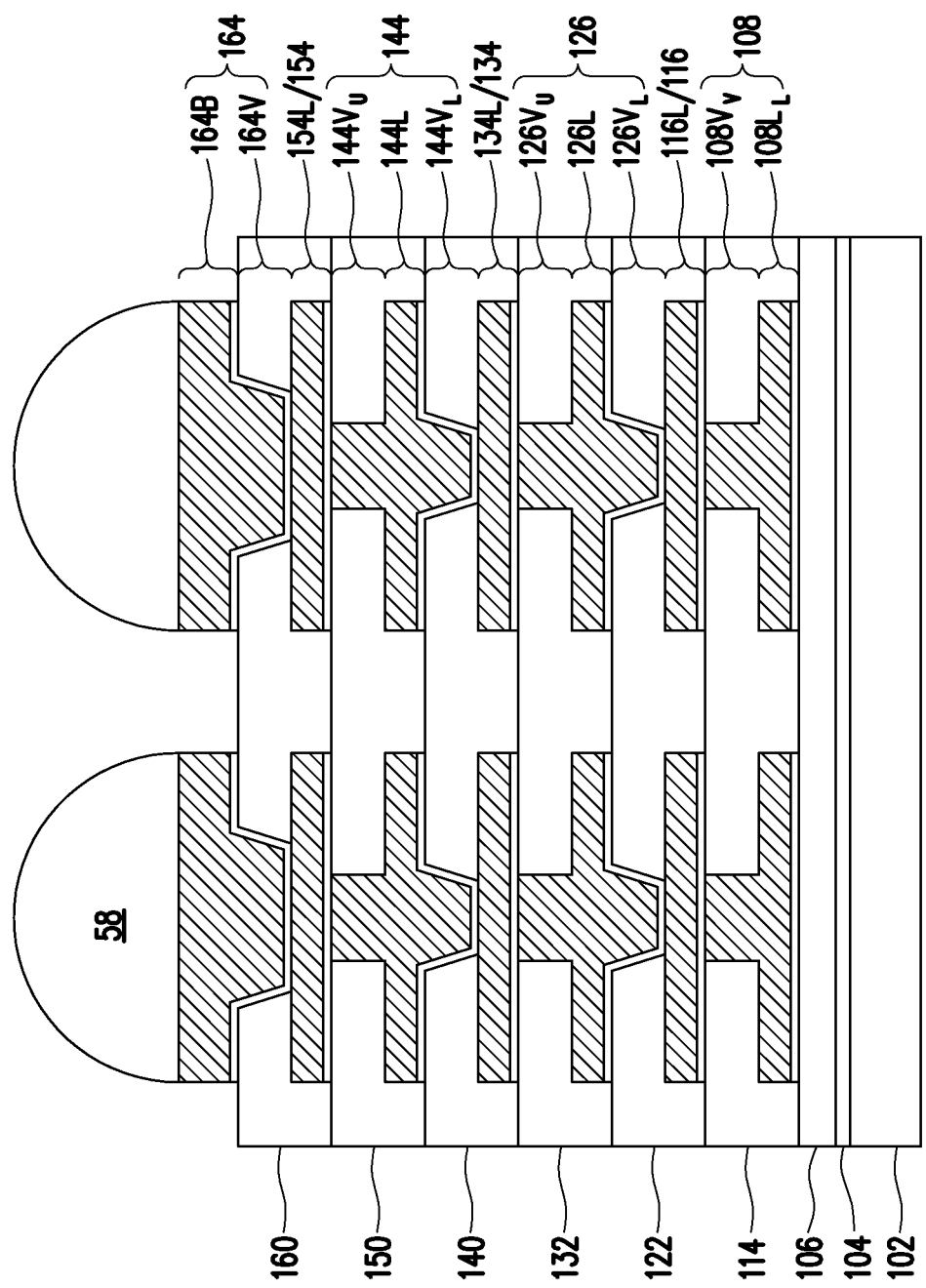
FIG. 27 illustrates a redistribution structure, in accordance with some other embodiments.

FIG. 27 illustrates a redistribution structure 52, in accordance with some other embodiments. In this embodiment, the redistribution structure 52 includes alternating layers of photosensitive and photoinsensitive materials. In particular, the dielectric layer 106 is formed of a photosensitive polymer, the dielectric layers 114, 132, 150 are formed of a photoinsensitive molding compound, and the dielectric layers 122, 140, 160 are formed of a photosensitive molding compound. The metallization pattern 108 includes conductive lines 108L and conductive vias 108V. The metallization patterns 116, 134, 154 each, respectively, include conductive lines 116L, 134L, 154L and omit conductive vias. In each place where a photoinsensitive molding compound is formed on a photosensitive molding compound, the corresponding metallization pattern includes a lower conductive via extending through the photosensitive molding compound and an upper conductive via extending through the photoinsensitive molding compound. For example, the metallization pattern 126 includes a lower conductive via $126V_L$ extending through the dielectric layer 122, a conductive line 126L extending along the dielectric layer 122, and an upper conductive via $126V_U$ extending through the dielectric layer 132. Likewise, the metallization pattern 144 includes a lower conductive via $144V_L$ extending through the dielectric layer 140, a conductive line 144L extending along the dielectric layer 140, and an upper conductive via $144V_U$ extending through the dielectric layer 150.

Figure 28:
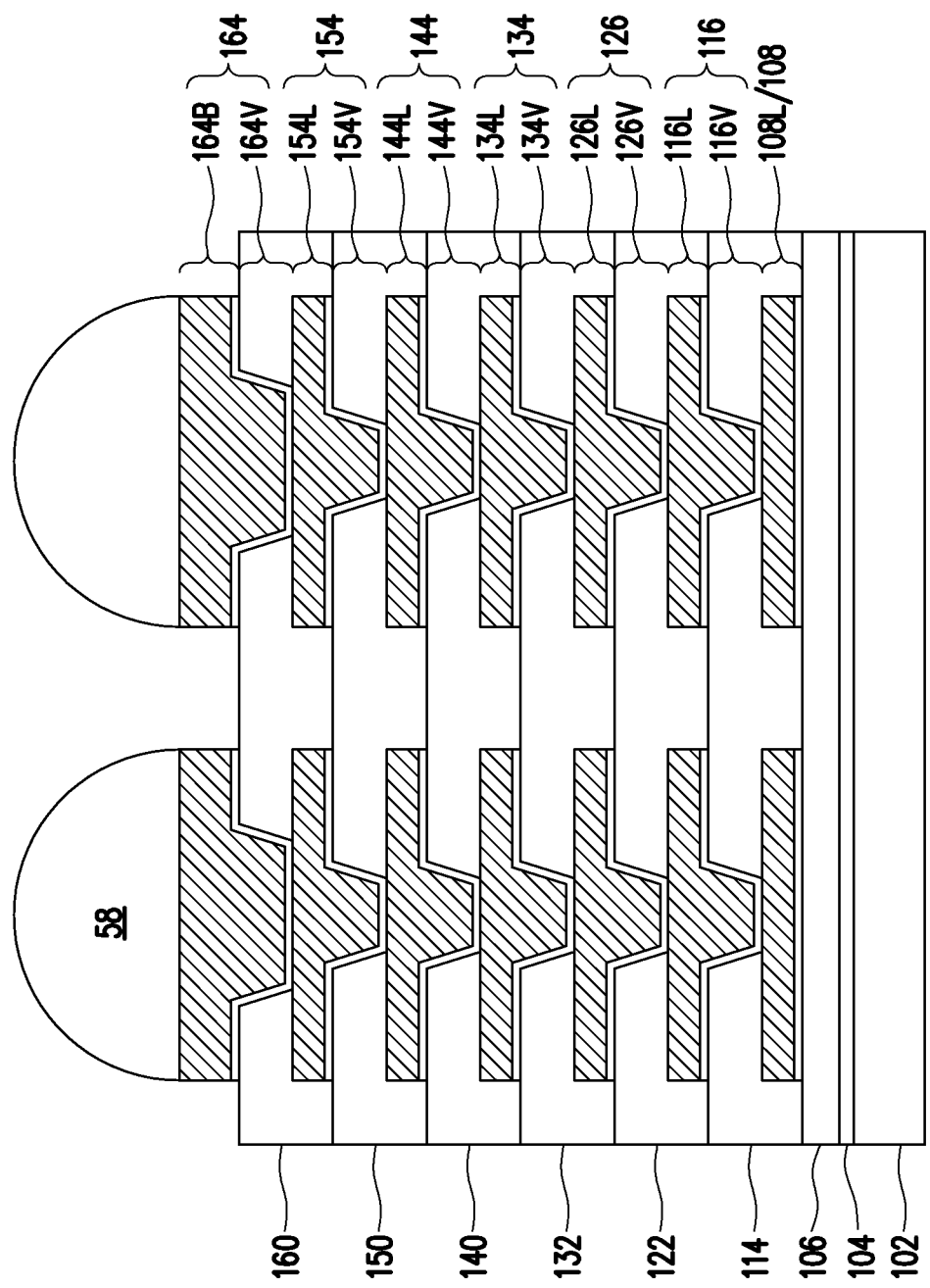
FIG. 28 illustrates a redistribution structure, in accordance with some other embodiments.

FIG. 28 illustrates a redistribution structure 52, in accordance with some other embodiments. In this embodiment, all of the layers of the redistribution structure 52 are a photosensitive material. In particular, the dielectric layer 106 is formed of a photosensitive polymer, and the dielectric layers 114, 122, 132, 140, 150, 160 are formed of a photosensitive molding compound. The metallization pattern 108 includes conductive lines 108L and omits conductive vias. The metallization patterns 116, 126, 134, 144, 154 each, respectively, include conductive lines 116L, 126L, 134L, 144L, 154L extending along, respectively, the dielectric layers 114, 122, 132, 140, 150. Further, the metallization patterns 116, 126, 134, 144, 154 each, respectively, include conductive vias 116V, 126V, 134V, 144V, 154V extending through, respectively, the dielectric layers 114, 122, 132, 140, 150.

FIGS. 29 through 40 illustrate cross-sectional views of intermediate steps during a process for forming a package component 400, in accordance with some embodiments. A first package region 400A is shown, in which the package component 400 is formed. It should be appreciated that multiple adjacent package regions 400A can be simultaneously formed, and a package component 400 can be formed in each of the package regions 400A. The package component 400 may be referred to as an integrated fan-out (InFO) package.

Figure 29:
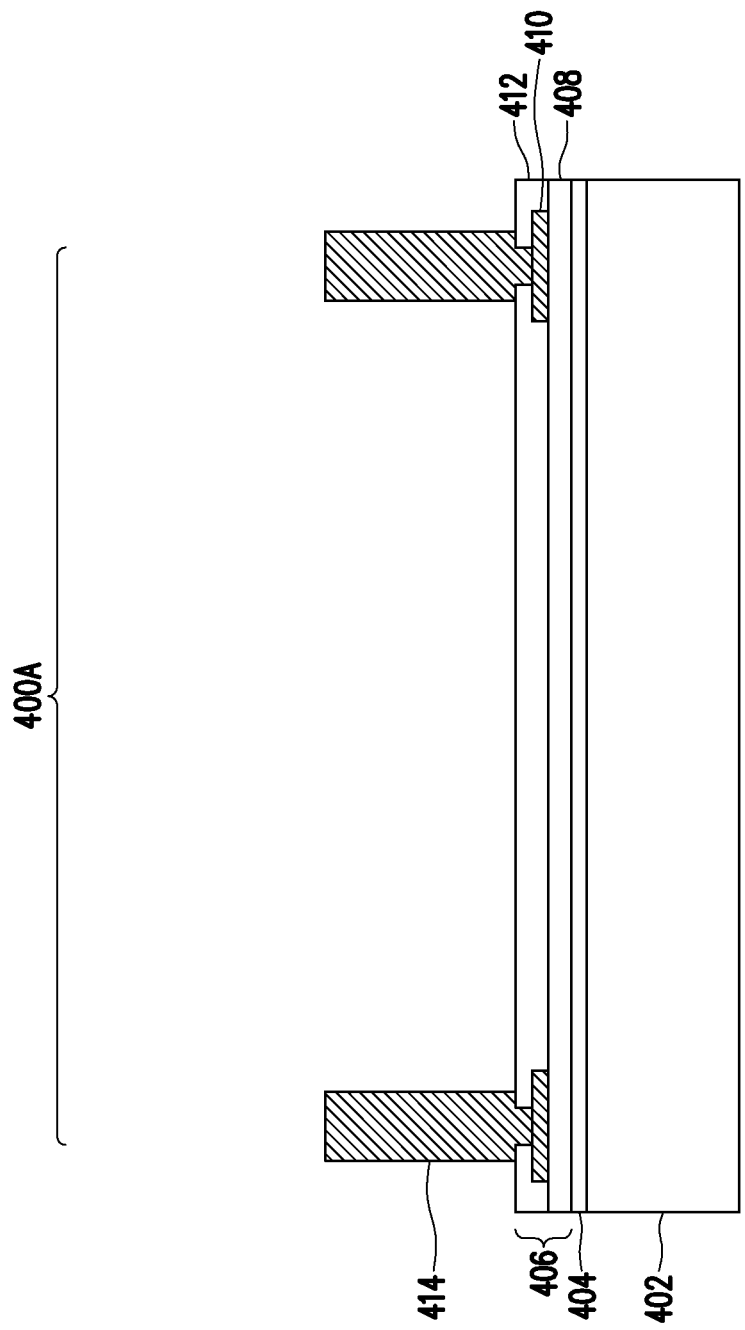
FIGS. 29 through 40 are cross-sectional views of intermediate steps during a process for forming a package component, in accordance with some embodiments.

In FIG. 29, a carrier substrate 402 is provided, and a release layer 404 is formed on the carrier substrate 402. The carrier substrate 402 may be similar to the carrier substrate 102, and the release layer 404 may be similar to the release layer 104.

A back-side redistribution structure 406 may be formed on the release layer 404. In the embodiment shown, the back-side redistribution structure 406 includes a dielectric layer 408, a metallization pattern 410 (sometimes referred to as redistribution layers or redistribution lines), and a dielectric layer 412. The back-side redistribution structure 406 is optional. In some embodiments, a dielectric layer without metallization patterns is formed on the release layer 404 in lieu of the back-side redistribution structure 406.

The dielectric layer 408 may be formed on the release layer 404. The bottom surface of the dielectric layer 408 may be in contact with the top surface of the release layer 404. In some embodiments, the dielectric layer 408 is formed of a photosensitive polymer, such as polybenzoxazole (PBO), polyimide, low temperature polyimide (LTPI), benzocyclobutene (BCB), or the like. In other embodiments, the dielectric layer 408 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 408 may be formed by spin coating, lamination, chemical vapor deposition (CVD), or the like.

The metallization pattern 410 may be formed on the dielectric layer 408. As an example to form metallization pattern 410, a seed layer is formed over the dielectric layer 408. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 410. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 410.

The dielectric layer 412 may be formed on the metallization pattern 410 and the dielectric layer 408. In some embodiments, the dielectric layer 412 is formed of a polymer, which may be a photosensitive material such as PBO, polyimide, low temperature polyimide (LTPI), BCB, or the like, that may be patterned using a lithography mask. In other embodiments, the dielectric layer 412 is formed of a nitride such as silicon nitride; an oxide such as silicon oxide, PSG, BSG, BPSG; or the like. The dielectric layer 412 may be formed by spin coating, lamination, CVD, the like, or a combination thereof.

It should be appreciated that the back-side redistribution structure 406 may include any number of dielectric layers and metallization patterns. If more dielectric layers and metallization patterns are to be formed, steps and processes discussed above may be repeated. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Next, through vias 414 are formed extending through and away from the topmost dielectric layer of the back-side redistribution structure 406 (e.g., the dielectric layer 412). The through vias 414 are optional, and as discussed further below, may be omitted. For example, the through vias 414 may (or may not) be omitted in embodiments where the back-side redistribution structure 406 is omitted. As an example to form the through vias 414, the dielectric layer 412 can be patterned to form openings exposing portions of the metallization pattern 410. The patterning may be formed by an acceptable process, such as by exposing the dielectric layer 412 to light when the dielectric layer 412 is a photosensitive material or by etching using, for example, an anisotropic etch. If the dielectric layer 412 is a photosensitive material, the dielectric layer 412 can be developed after the exposure. A seed layer is then formed over the dielectric layer 412 and portions of the metallization pattern 410 exposed by the openings. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 414.

Figure 30:
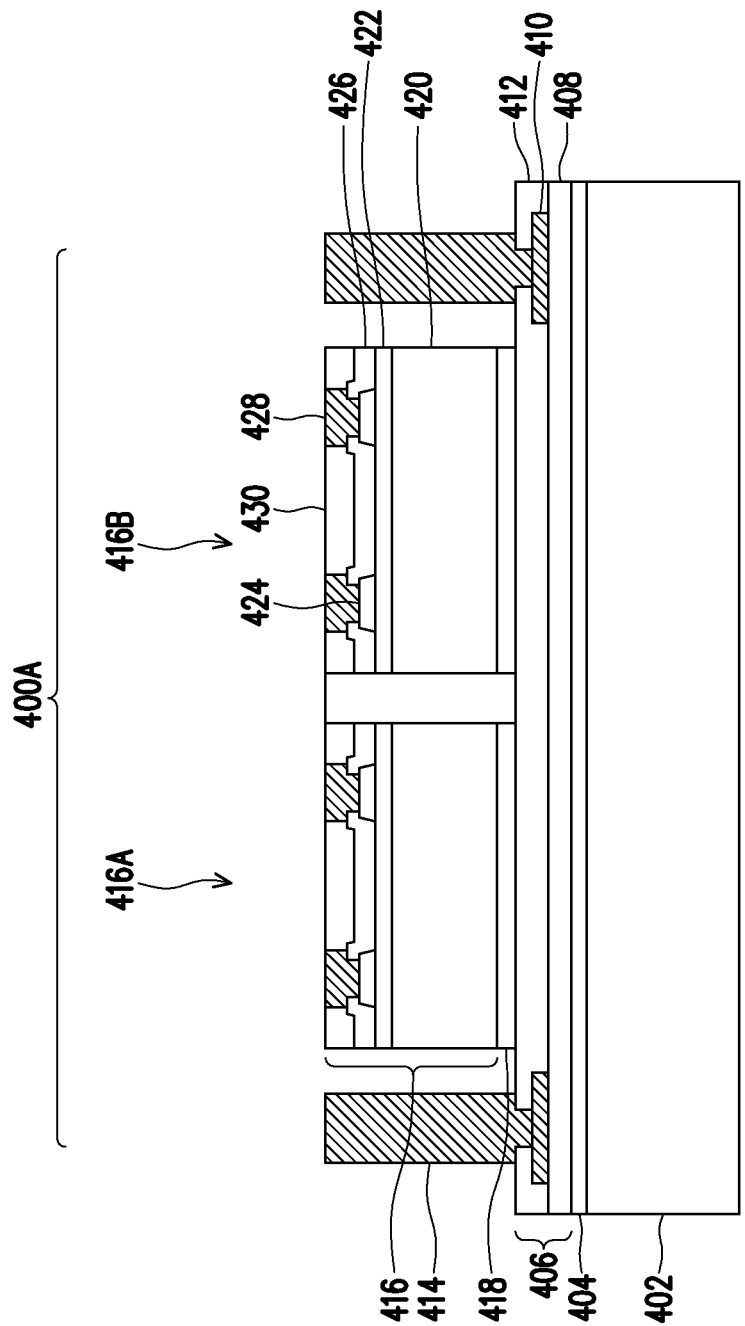

In FIG. 30, integrated circuit dies 416 are adhered to the dielectric layer 412 by an adhesive 418. A desired type and quantity of integrated circuit dies 416 are adhered in the first package region 400A. Each integrated circuit die 416 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In the embodiment shown, multiple integrated circuit dies 416, such as a first integrated circuit die 416A and a second integrated circuit die 416B, are adhered adjacent one another in the first package region 400A. In some embodiments, the first integrated circuit die 416A can be a logic die and the second integrated circuit die 416B can be a memory die. The adhesive 418 is on back-sides of the integrated circuit dies 416 and adheres the integrated circuit dies 416 to the back-side redistribution structure 406, such as to the dielectric layer 412. The adhesive 418 may be any suitable adhesive, epoxy, die attach film (DAF), or the like. The adhesive 418 may be applied to back-sides of the integrated circuit dies 416 or may be applied over the surface of the carrier substrate 402. For example, the adhesive 418 may be applied to the back-sides of the integrated circuit dies 416 before the integrated circuit dies 416 are singulated.

Before adhesion to the dielectric layer 412, each integrated circuit die 416 may be processed according to applicable manufacturing processes to form integrated circuits. For example, each integrated circuit die 416 includes a semiconductor substrate 420, such as silicon, doped or undoped, or an active layer of a semiconductor-on-insulator (SOI) substrate. The semiconductor substrate 420 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 420 has an active surface (e.g., the surface facing upwards in FIG. 30), sometimes called a front side, and an inactive surface (e.g., the surface facing downwards in FIG. 30), sometimes called a back side. Devices may be formed at the front surface of the semiconductor substrate 420. The devices may be active devices (e.g., transistors, diodes, etc.), capacitors, resistors, etc. An interconnect structure 422 is over the semiconductor substrate 420, and interconnects the devices to form an integrated circuit. The interconnect structure 422 may be formed by, for example, metallization patterns in dielectric layers on the semiconductor substrate 420. The metallization patterns include metal lines and vias formed in one or more low-k dielectric layers. The metallization patterns of the interconnect structure 422 are electrically coupled to the devices of the semiconductor substrate 420.

The integrated circuit die 416 further includes pads 424, such as aluminum pads, to which external connections are made. The pads 424 are on the active side of the integrated circuit die 416, such as in and/or on the interconnect structure 422. One or more passivation films 426 are on the integrated circuit die 416, such as on portions of the interconnect structure 422 and pads 424. Openings extend through the passivation films 426 to the pads 424. Die connectors 428, such as conductive pillars (for example, formed of a metal such as copper), extend through the openings in the passivation films 426 and are physically and electrically coupled to respective ones of the pads 424. The die connectors 428 may be formed by, for example, plating, or the like. The die connectors 428 electrically couple the respective integrated circuits of the integrated circuit die 416.

Optionally, solder regions (e.g., solder balls or solder bumps) may be disposed on the pads 424. The solder balls may be used to perform chip probe (CP) testing on the integrated circuit die 416. CP testing may be performed on the integrated circuit die 416 to ascertain whether the integrated circuit die 416 is a known good die (KGD). Thus, only integrated circuit dies 416, which are KGDs, undergo subsequent processing are packaged, and dies, which fail the CP testing, are not packaged. After testing, the solder regions may be removed in subsequent processing steps.

A dielectric layer 430 may (or may not) be on the active side of the integrated circuit die 416, such as on the passivation films 426 and the die connectors 428. The dielectric layer 430 laterally encapsulates the die connectors 428, and the dielectric layer 430 is laterally coterminous with the integrated circuit die 416. Initially, the dielectric layer 430 may bury the die connectors 428, such that the topmost surface of the dielectric layer 430 is above the topmost surfaces of the die connectors 428. In some embodiments where solder regions are disposed on the die connectors 428, the dielectric layer 430 may also bury the solder regions. Alternatively, the solder regions may be removed prior to forming the dielectric layer 430.

The dielectric layer 430 may be a polymer such as polybenzoxazole (PBO), polyimide, low temperature polyimide (LTPI), benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 430 may be formed, for example, by spin coating, lamination, chemical vapor deposition (CVD), or the like. In some embodiments, the die connectors 428 are exposed through the dielectric layer 430 during formation of the integrated circuit die 416. In some embodiments, the die connectors 428 remain buried and are exposed during a subsequent process for packaging the integrated circuit die 416. Exposing the die connectors 428 may remove any solder regions that may be present on the die connectors 428.

Figure 31:
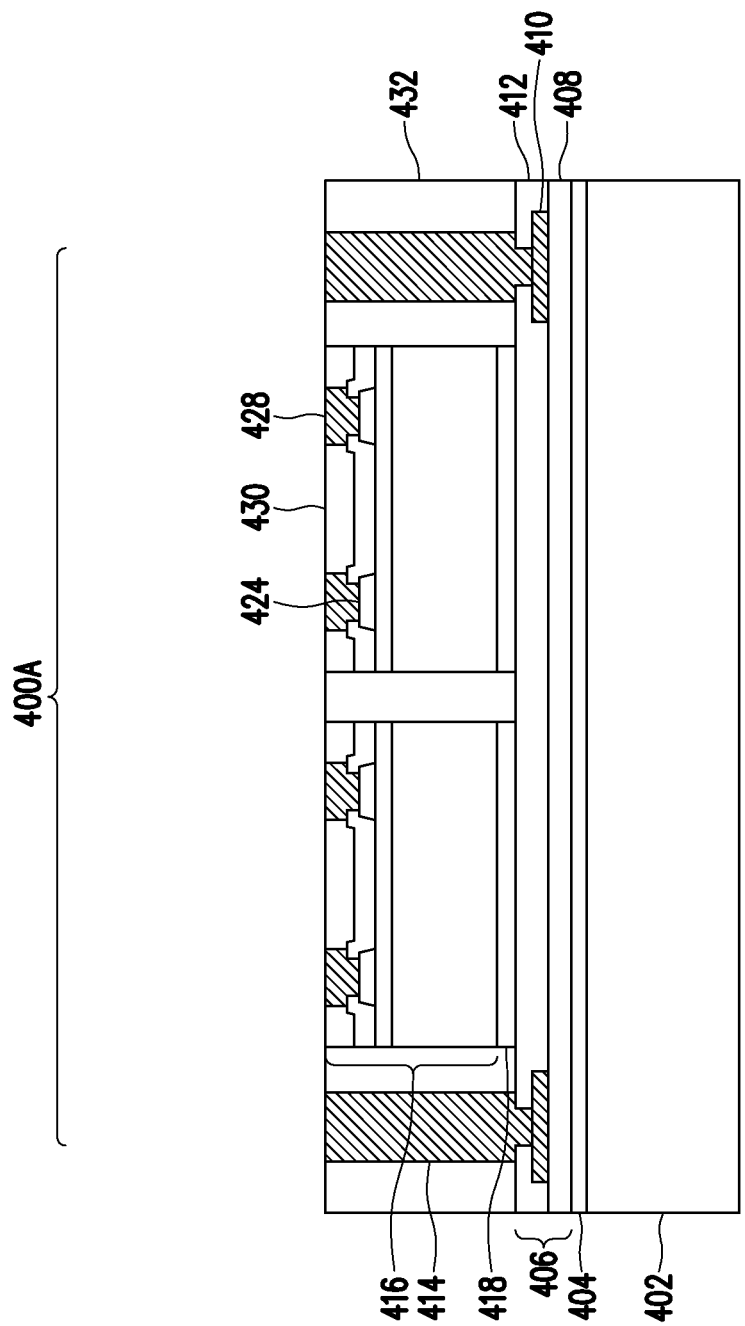

In FIG. 31, an encapsulant 432 is formed on and around the various components. After formation, the encapsulant 432 encapsulates the through vias 414 and integrated circuit dies 416. The encapsulant 432 may be a molding compound, epoxy, or the like. The encapsulant 432 may be applied by compression molding, transfer molding, or the like, and may be formed over the carrier substrate 402 such that the through vias 414 and/or the integrated circuit dies 416 are buried or covered. The encapsulant 432 is further formed in gap regions between the integrated circuit dies 416, if present. The encapsulant 432 may be applied in liquid or semi-liquid form and then subsequently cured.

A planarization process may be performed on the encapsulant 432 to expose the through vias 414 and the die connectors 428. The planarization process may remove material of the through vias 414, die connectors 428, and/or dielectric layer 430 until the die connectors 428 and through vias 414 are exposed. Top surfaces of the through vias 414, die connectors 428, dielectric layer 430, and encapsulant 432 are coplanar after the planarization process. The planarization process may be, for example, a chemical-mechanical polish (CMP), a grinding process, or the like.

Figure 32:
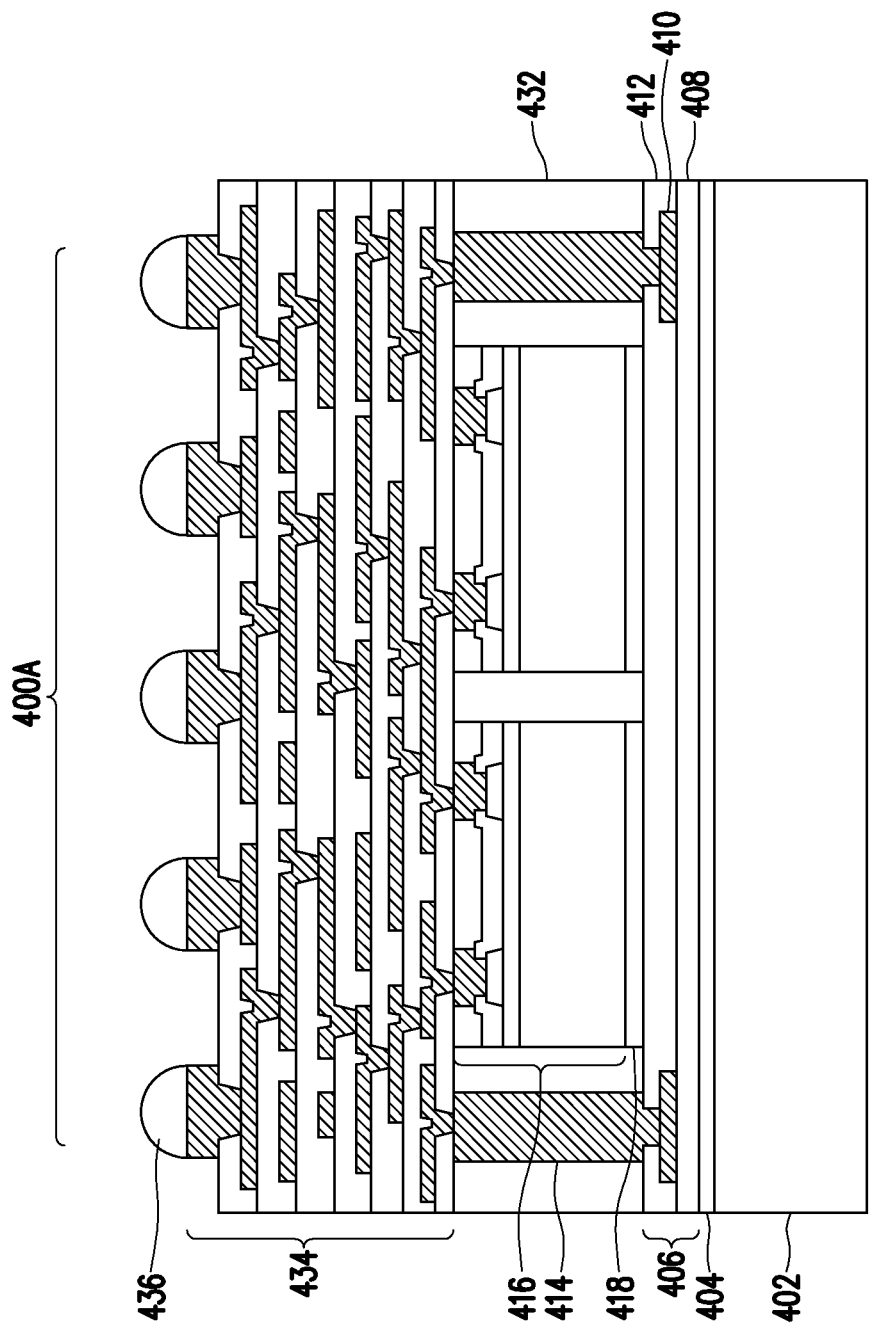

In FIG. 32, a redistribution structure 434 is formed on the release layer 104, and external connectors 436 are formed on to the redistribution structure 434. FIGS. 33 through 39 are various views of intermediate steps during a process for forming the redistribution structure 434, in accordance with some embodiments. A detailed view of a region of the redistribution structure 434 is shown. Some features in FIGS. 33 through 39 are omitted from FIG. 32 for simplicity of illustration. The redistribution structure 434 includes dielectric layers 438, 448, 456, 464, 472, 480, 490; metallization patterns 442, 450, 458, 466, 474, 484; and UBMs 492. The redistribution structure 434 is shown as an example having six layers of metallization patterns. More or fewer dielectric layers and metallization patterns may be formed in the redistribution structure 434 by, respectively, repeating or omitting the steps and process discussed herein.

Figure 33:
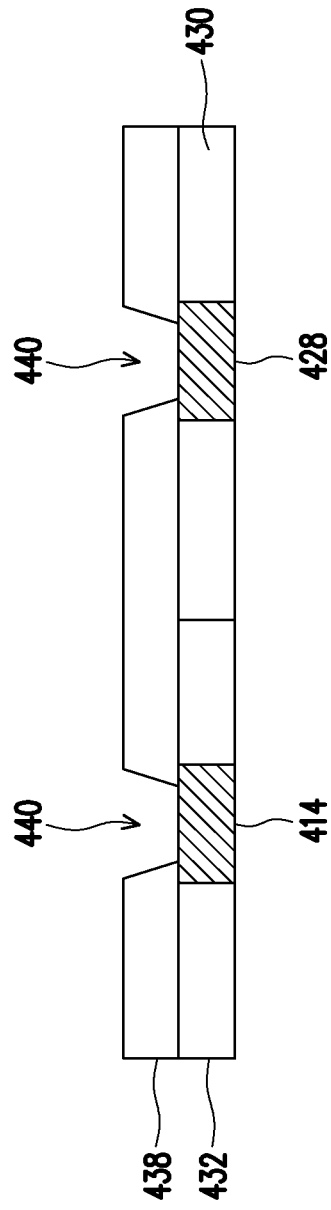

In FIG. 33, the dielectric layer 438 is deposited on the through vias 414, die connectors 428, and encapsulant 432. In some embodiments, the dielectric layer 438 is formed of a photosensitive material such as PBO, polyimide, low temperature polyimide (LTPI), BCB, or the like, which may be patterned using a lithography mask. The dielectric layer 438 may be formed by spin coating, lamination, CVD, the like, or a combination thereof. The dielectric layer 438 is then patterned. The patterning forms openings 440 exposing portions of the through vias 414 and the die connectors 428. The patterning may be by an acceptable process, such as by exposing the dielectric layer 438 to light when the dielectric layer 438 is a photosensitive material or by etching using, for example, an anisotropic etch. If the dielectric layer 438 is a photosensitive material, the dielectric layer 438 can be developed after the exposure.

Figure 34:
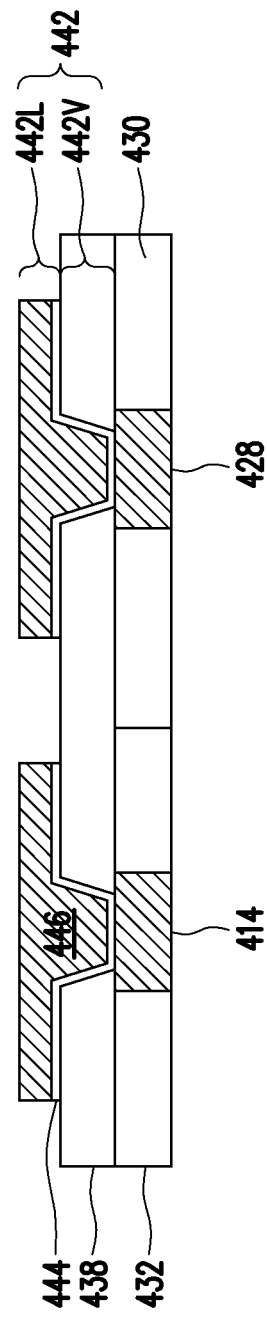

In FIG. 34, the metallization pattern 442 is formed. The metallization pattern 442 includes conductive lines 442L on and extending along the major surface of the dielectric layer 438. The metallization pattern 442 also includes conductive vias 442V extending through the dielectric layer 438. As an example to form the metallization pattern 442, a seed layer 444 is formed over the dielectric layer 438 and in the openings 440 extending through the dielectric layer 438. In some embodiments, the seed layer 444 is a metal layer, which may be a single layer or a composite layer comprising a plurality of sub-layers formed of different materials. In some embodiments, the seed layer 444 comprises a titanium layer and a copper layer over the titanium layer. The seed layer 444 may be formed using, for example, PVD or the like. A photoresist is then formed and patterned on the seed layer 444. The photoresist may be formed by spin coating or the like and may be exposed to light for patterning. The pattern of the photoresist corresponds to the metallization pattern 442. The patterning forms openings through the photoresist to expose the seed layer 444. A conductive material 446 is then formed in the openings of the photoresist and on the exposed portions of the seed layer 444. The conductive material 446 may be formed by plating, such as electroplating or electroless plating, or the like. The conductive material 446 may comprise a metal, like copper, titanium, tungsten, aluminum, or the like. The combination of the conductive material 446 and underlying portions of the seed layer 444 form the metallization pattern 442. The photoresist and portions of the seed layer 444 on which the conductive material 446 is not formed are removed. The photoresist may be removed by an acceptable ashing or stripping process, such as using an oxygen plasma or the like. Once the photoresist is removed, exposed portions of the seed layer 444 are removed, such as by using an acceptable etching process, such as by wet or dry etching.

Figure 35:
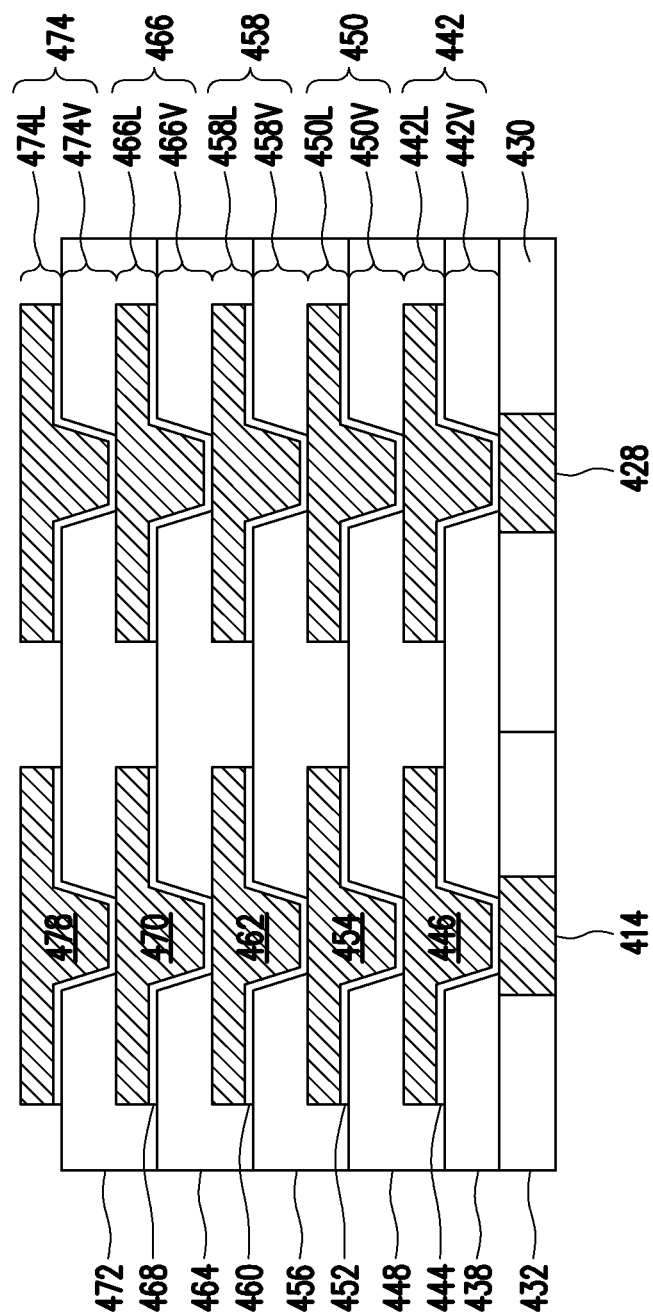

In FIG. 35, the dielectric layer 448 is deposited on the metallization pattern 442 and dielectric layer 438. The dielectric layer 448 may be formed of a similar material and in a similar manner as the dielectric layer 438. The dielectric layer 448 is then patterned with openings exposing portions of the metallization pattern 442. The metallization pattern 450 is then formed. The metallization pattern 450 includes conductive lines 450L on and extending along the major surface of the dielectric layer 448. The metallization pattern 450 also includes conductive vias 450V extending through the openings in the dielectric layer 448. The metallization pattern 450 may be formed of a similar material and in a similar manner as the metallization pattern 442. For example, the metallization pattern 450 can comprise a seed layer 452 and a conductive material 454 on the seed layer 452.

The dielectric layer 456 is deposited on the metallization pattern 450 and dielectric layer 448. The dielectric layer 456 may be formed of a similar material and in a similar manner as the dielectric layer 438. The dielectric layer 456 is then patterned with openings exposing portions of the metallization pattern 450. The metallization pattern 458 is then formed. The metallization pattern 458 includes conductive lines 458L on and extending along the major surface of the dielectric layer 456. The metallization pattern 458 also includes conductive vias 458V extending through the openings in the dielectric layer 456. The metallization pattern 458 may be formed of a similar material and in a similar manner as the metallization pattern 442. For example, the metallization pattern 458 can comprise a seed layer 460 and a conductive material 462 on the seed layer 460.

The dielectric layer 464 is deposited on the metallization pattern 458 and dielectric layer 456. The dielectric layer 464 may be formed of a similar material and in a similar manner as the dielectric layer 438. The dielectric layer 464 is then patterned with openings exposing portions of the metallization pattern 458. The metallization pattern 466 is then formed. The metallization pattern 466 includes conductive lines 466L on and extending along the major surface of the dielectric layer 464. The metallization pattern 466 also includes conductive vias 466V extending through the openings in the dielectric layer 464. The metallization pattern 466 may be formed of a similar material and in a similar manner as the metallization pattern 442. For example, the metallization pattern 466 can comprise a seed layer 468 and a conductive material 470 on the seed layer 468.

The dielectric layer 472 is deposited on the metallization pattern 466 and dielectric layer 464. The dielectric layer 472 may be formed of a similar material and in a similar manner as the dielectric layer 438. The dielectric layer 472 is then patterned with openings exposing portions of the metallization pattern 466. The metallization pattern 474 is then formed. The metallization pattern 474 includes conductive lines 474L on and extending along the major surface of the dielectric layer 472. The metallization pattern 474 also includes conductive vias 474V extending through the openings in the dielectric layer 472. The metallization pattern 474 may be formed of a similar material and in a similar manner as the metallization pattern 442. For example, the metallization pattern 474 can comprise a seed layer 476 and a conductive material 478 on the seed layer 476.

Figure 36:
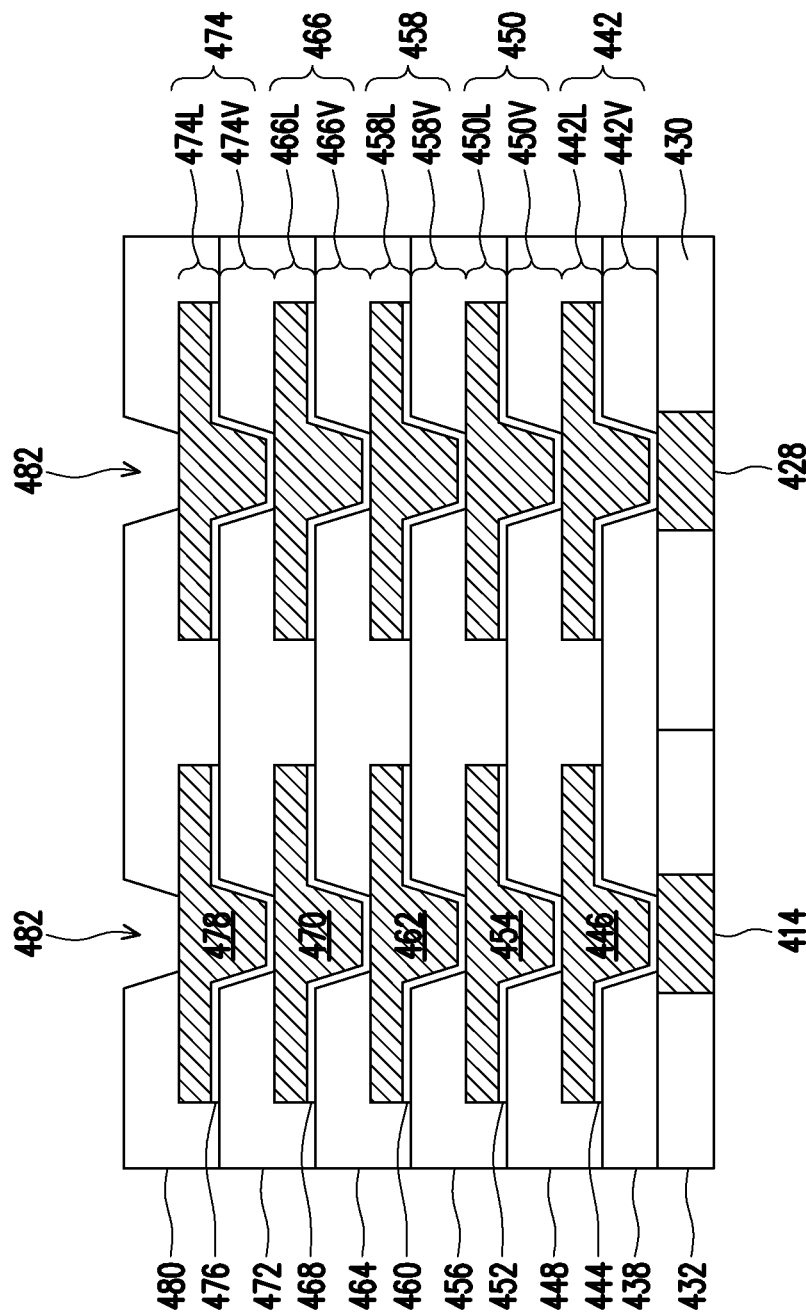

In FIG. 36, the dielectric layer 480 is formed around the metallization pattern 474 and on the dielectric layer 472. The dielectric layer 480 is formed of a photosensitive molding compound, which is similar to the photosensitive molding compound of the dielectric layer 122 (see FIG. 11). Higher levels of the redistribution structure 434 have large dimensions, e.g., large thicknesses, and as discussed above, the photosensitive molding compound can be formed to large thicknesses at a low cost. The dielectric layer 480 is then patterned. The patterning forms openings 482 exposing portions of the metallization pattern 474. The patterning may be by a similar process as the process for patterning the dielectric layer 122 (see FIG. 11).

Figure 37:
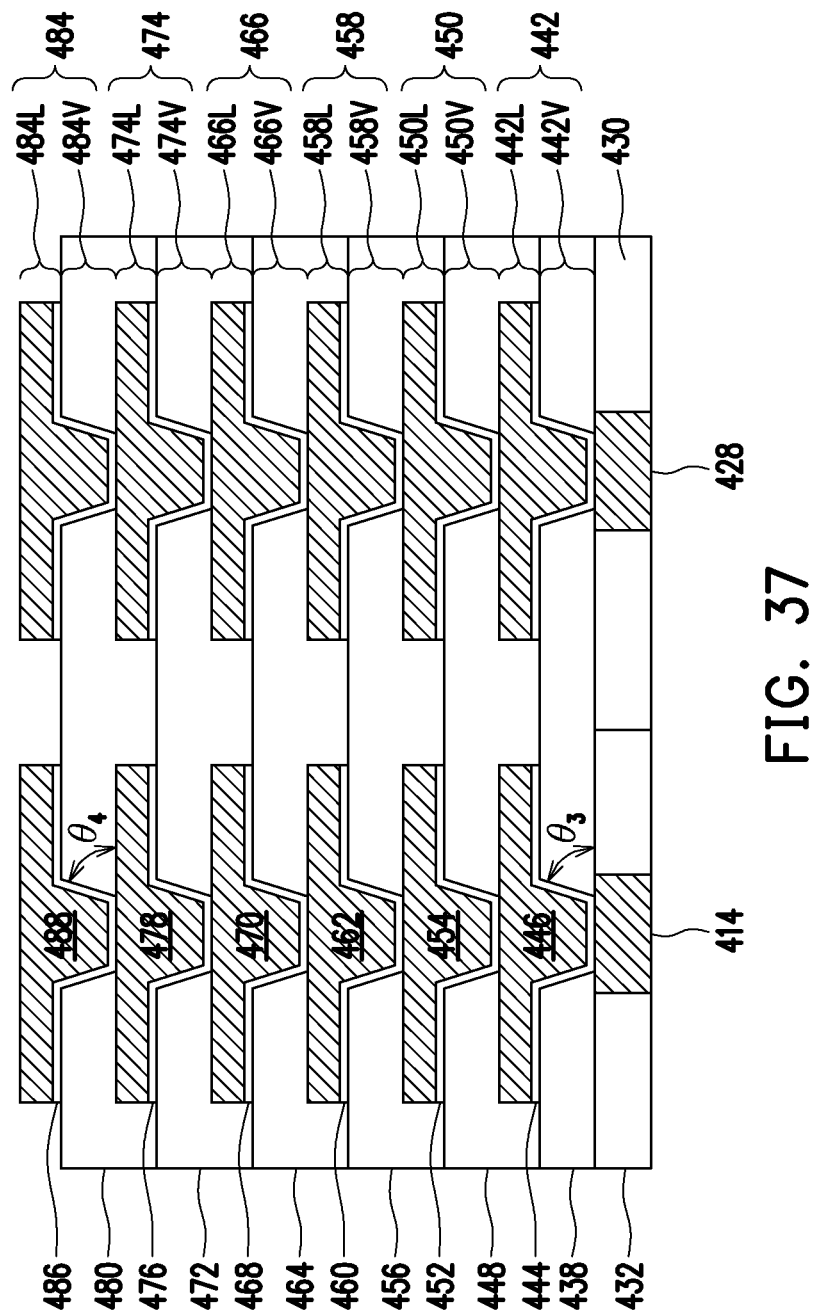

In FIG. 37, the metallization pattern 484 is formed. The metallization pattern 484 includes conductive lines 484L on and extending along the major surface of the dielectric layer 480. The metallization pattern 484 also includes conductive vias 484V extending through the openings 482 in the dielectric layer 480. The metallization pattern 484 may be formed of a similar material and in a similar manner as the metallization pattern 442. For example, the metallization pattern 484 can comprise a seed layer 486 and a conductive material 488 on the seed layer 486.

Because the metallization patterns 442 and 484 are formed by different techniques, their respective conductive vias 442V and 484V form different angles with underlying features. Sidewalls of the conductive vias 442V form a third angle $\theta_3$ with a major surface of the encapsulant 432, and sidewalls of the conductive via 484V form a fourth angle $\theta_4$ with a major surface of the conductive line 474L. For example, the angle $\theta_3$ can be in the range of about 70 degrees to about 80 degrees, and the angle $\theta_4$ can be in the range of about 60 degrees to about 70 degrees. The third angle $\theta_3$ is greater than the fourth angle $\theta_4$.

Figure 38:
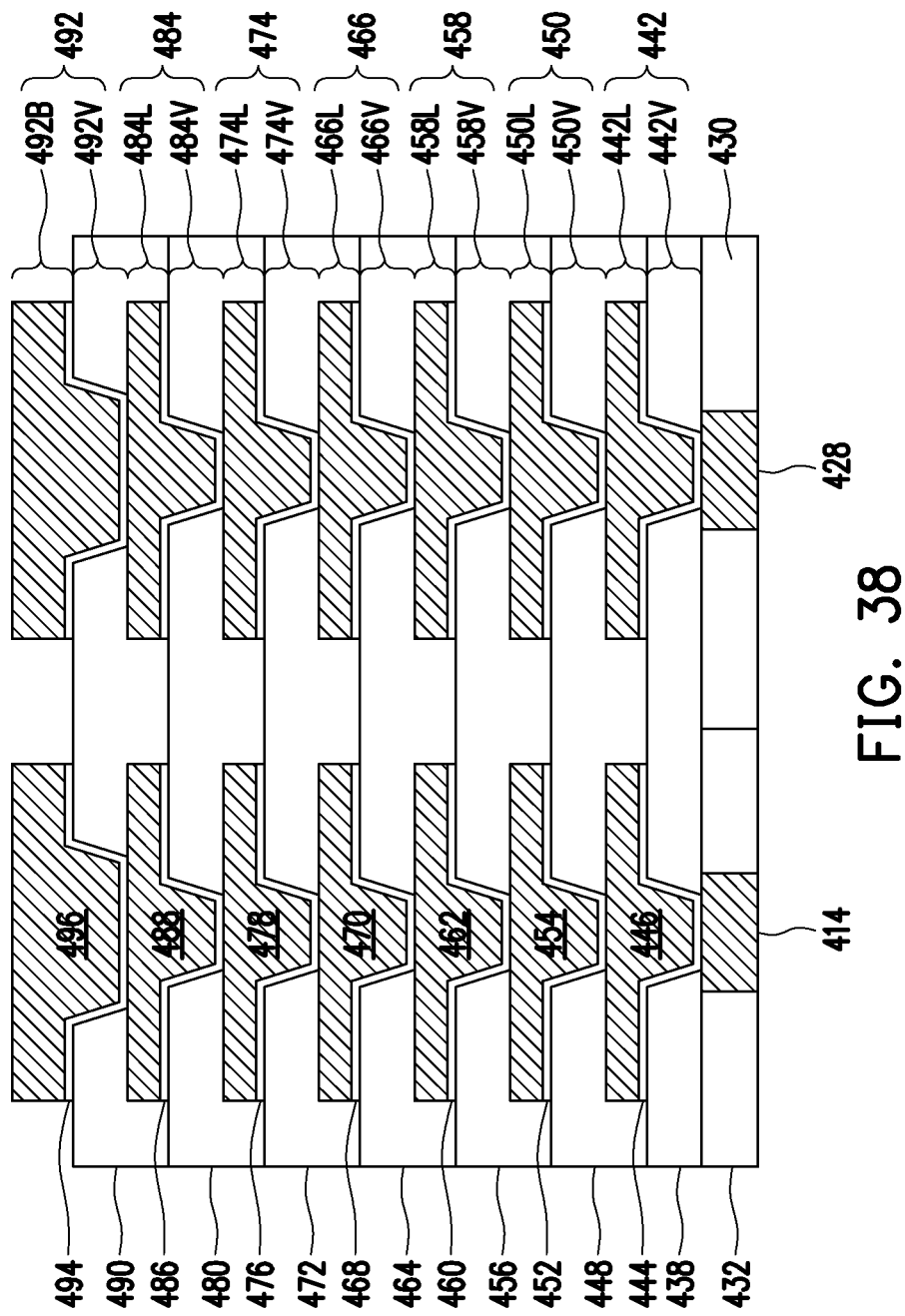

In FIG. 38, the dielectric layer 490 is deposited on the metallization pattern 484 and dielectric layer 480. The dielectric layer 490 may be formed of a similar material and in a similar manner as the dielectric layer 480. The dielectric layer 490 is then patterned with openings exposing portions of the metallization pattern 484. The UBMs 492 are then formed. The UBMs 492 include bumps 492B on and extending along the major surface of the dielectric layer 490. The UBMs 492 also include conductive vias 492V extending through the openings in the dielectric layer 490. The UBMs 492 may be formed of a similar material and in a similar manner as the metallization pattern 484. For example, the UBMs 492 can comprise a seed layer 494 and a conductive material 496 on the seed layer 494.

Figure 39:
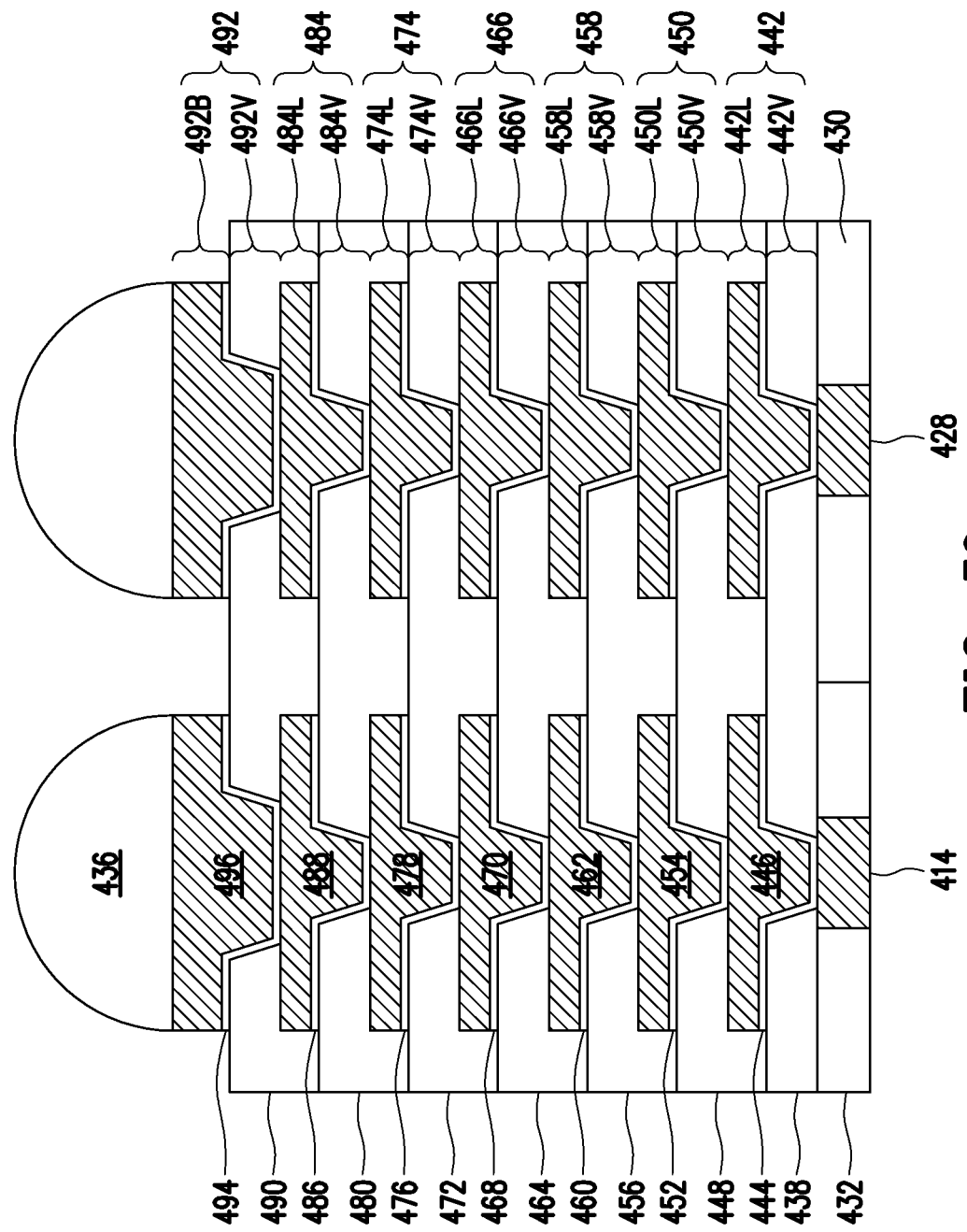

In FIG. 39, the external connectors 436 are formed on the UBMs 492. The external connectors 436 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The external connectors 436 may include a conductive material such as solder, copper, aluminum, gold, nickel, silver, palladium, tin, the like, or a combination thereof. In some embodiments, the external connectors 436 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the external connectors 436 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 40:
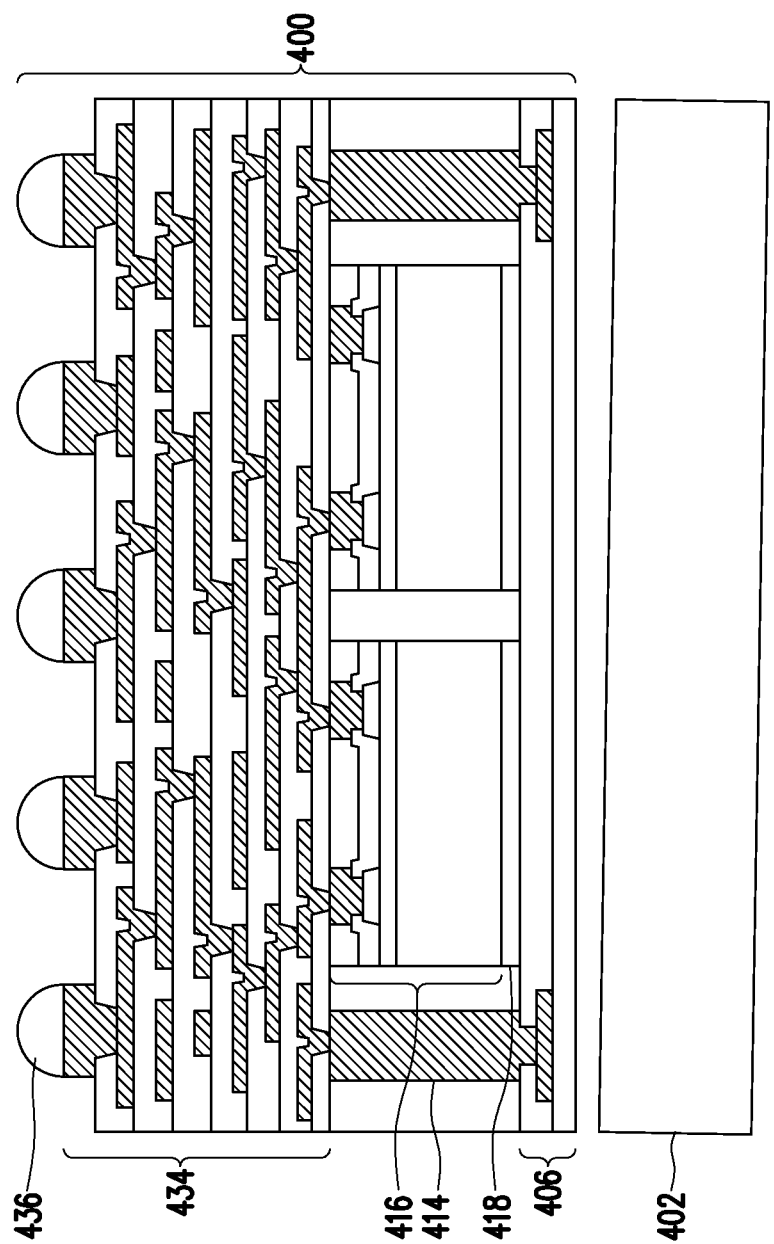

In FIG. 40, a carrier substrate de-bonding is performed to detach (or "de-bond") the carrier substrate 402 from the back-side redistribution structure 406, e.g., the dielectric layer 408. In accordance with some embodiments, the de-bonding includes projecting a light such as a laser light or an UV light on the release layer 404 so that the release layer 404 decomposes under the heat of the light and the carrier substrate 402 can be removed. A singulation process is then performed by sawing along scribe line regions, e.g., around the first package region 400A. The sawing singulates the first package region 400A from adjacent package regions. The resulting, singulated package component 400 is from the first package region 400A.

Figure 41:
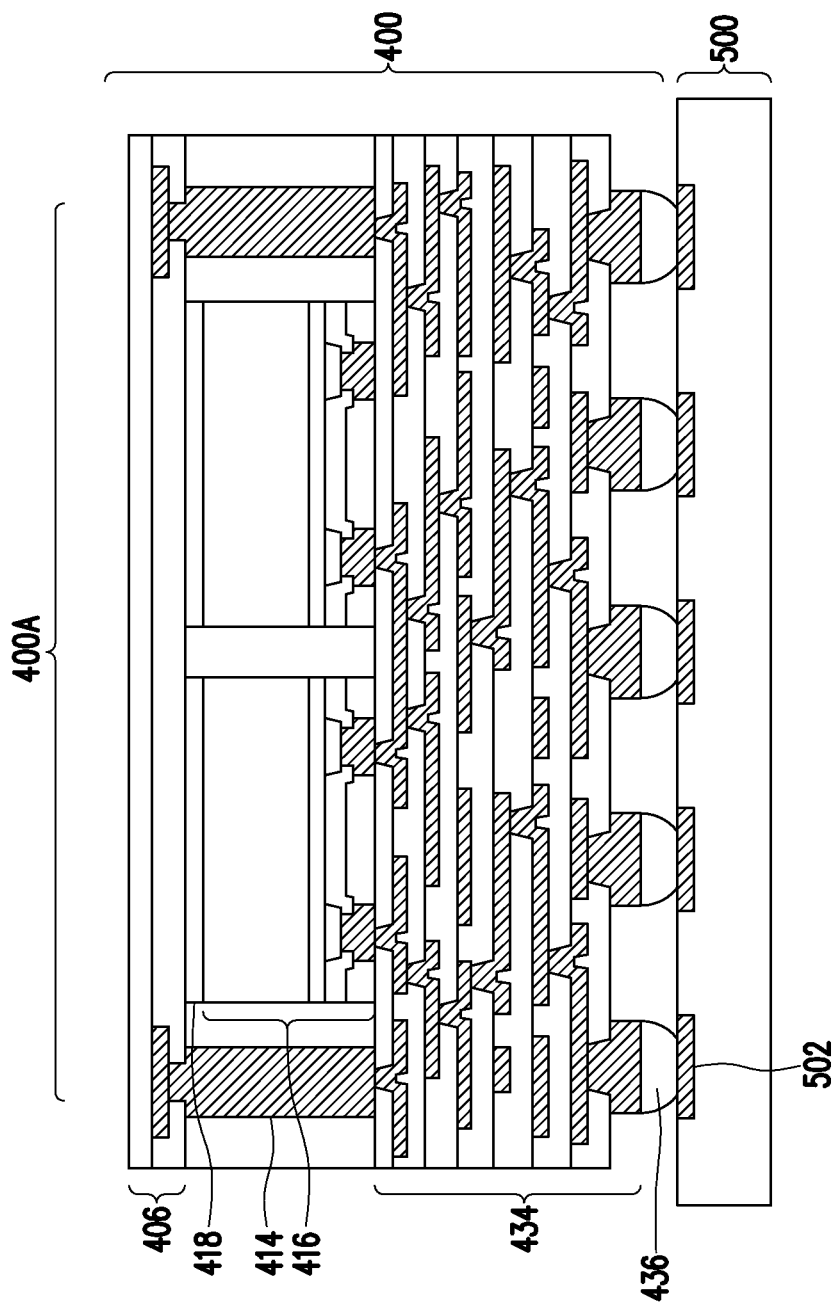
FIG. 41 illustrates a system including a package component, in accordance with some embodiments.

FIG. 41 illustrates a system including a package component 400, in accordance with some embodiments. In this embodiment, the package component 400 is mounted to a package substrate 500 using the external connectors 436. The package substrate 500 can be similar to the package substrate 312, e.g., can include bond pads 502 to which the external connectors 436 are bonded.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Forming a redistribution structure from a combination of photoinsensitive molding compound layers and photosensitive molding compound layers allows layers with power and/or ground connections to have high electrical and mechanical performance, and allows layers with data connections to be formed at a lower cost. Further, forming a redistribution structure from a combination of photosensitive polymer layers and photosensitive molding compound layers allows upper layers of the redistribution structure to have a greater electrical and mechanical performance than lower layers, while keeping manufacturing costs low.

In an embodiment, a device includes: a semiconductor device; and a redistribution structure including: a first metallization pattern including a first conductive line and a first conductive via, the first conductive line being electrically coupled to the semiconductor device, the first conductive via being disposed on the first conductive line; a first dielectric layer surrounding the first metallization pattern, surfaces of the first dielectric layer and the first conductive via being planar, the first dielectric layer including a first molding compound; a second metallization pattern including a second conductive line extending along a major surface of the first dielectric layer; a second dielectric layer disposed around the second metallization pattern and on the first dielectric layer, the second dielectric layer including a second molding compound, the second molding compound being different from the first molding compound; and a third metallization pattern including a third conductive line and a second conductive via, the third conductive line extending along a major surface of the second dielectric layer, the second conductive via extending through the second dielectric layer to electrically couple the second metallization pattern.

In some embodiments of the device, a first sidewall of the first conductive via forms a first angle with a major surface of the first conductive line, and a second sidewall of the second conductive via forms a second angle with a major surface of the second conductive line, the first angle being greater than the second angle. In some embodiments of the device, the first molding compound includes a first resin and first fillers disposed in the first resin, and the second molding compound includes a second resin and second fillers disposed in the second resin, the first resin being different from the second resin, the first fillers being different from the second fillers. In some embodiments of the device, the first fillers occupy a first volume of the first molding compound, the second fillers occupy a second volume of the second molding compound, and the first volume is greater than the second volume. In some embodiments of the device, the first fillers are silica and the second fillers are barium sulfate. In some embodiments of the device, the first molding compound has a greater Young's Modulus than the second molding compound, the first molding compound has a lesser coefficient of thermal expansion than the second molding compound, the first molding compound has a lesser dielectric constant than the second molding compound, and the first molding compound has a lesser dissipation factor than the second molding compound. In some embodiments of the device, the third metallization pattern further includes a third conductive via disposed on the third conductive line, and the redistribution structure further includes a third dielectric layer surrounding the third metallization pattern, surfaces of the third dielectric layer and the third conductive via being planar, the third dielectric layer including the first molding compound. In some embodiments of the device, the first dielectric layer has a first thickness, the second dielectric layer has a second thickness, and the first thickness is greater than the second thickness.

In an embodiment, a device includes: an integrated circuit die; an encapsulant surrounding the integrated circuit die, surfaces of the encapsulant and the integrated circuit die being planar; a first dielectric layer over the encapsulant and the integrated circuit die, the first dielectric layer including a polymer material; a first metallization pattern including a first conductive line and a first conductive via, the first conductive line extending along a major surface of the first dielectric layer, the first conductive via extending through the first dielectric layer to electrically couple the integrated circuit die; a second dielectric layer over the first metallization pattern and the first dielectric layer, the second dielectric layer including a molding material, the molding material being different from the polymer material; and a second metallization pattern including a second conductive line and a second conductive via, the second conductive line extending along a major surface of the second dielectric layer, the second conductive via extending through the second dielectric layer to electrically couple the first conductive line.

In some embodiments, the device further includes: a through via extending through the encapsulant, the first dielectric layer being over the through via, the first metallization pattern being electrically coupled to the through via. In some embodiments of the device, a first sidewall of the first conductive via forms a first angle with a major surface of the encapsulant, and a second sidewall of the second conductive via forms a second angle with a major surface of the first conductive line, the first angle being greater than the second angle. In some embodiments of the device, the polymer material is low temperature polyimide, the low temperature polyimide being free from fillers. In some embodiments of the device, the molding material includes: a resin; and fillers disposed in the resin. In some embodiments of the device, the resin is epoxy or acrylic. In some embodiments of the device, the fillers are silica or barium sulfate. In some embodiments of the device, fillers have a diameter in a range of 0.5 µm to 2 µm, and occupy from 40% to 60% of the volume of the second dielectric layer.

In an embodiment, a method includes: dispensing a first dielectric layer around and on a first metallization pattern, the first dielectric layer including a photoinsensitive molding compound; planarizing the first dielectric layer such that surfaces of the first dielectric layer and the first metallization pattern are planar; forming a second metallization pattern on the first dielectric layer and the first metallization pattern; dispensing a second dielectric layer around the second metallization pattern and on the first dielectric layer, the second dielectric layer including a photosensitive molding compound; patterning the second dielectric layer with openings exposing portions of the second metallization pattern; and forming a third metallization pattern on the second dielectric layer and in the openings extending through the second dielectric layer, the third metallization pattern coupled to the portions of the second metallization pattern exposed by the openings.

In some embodiments of the method, the photoinsensitive molding compound includes a photoinsensitive resin and first fillers disposed in the photoinsensitive resin, the photosensitive molding compound includes a photosensitive resin and second fillers disposed in the photosensitive resin, the second fillers having smaller diameters than the first fillers. In some embodiments of the method, patterning the second dielectric layer includes: exposing the photosensitive resin to light; developing the photosensitive resin; and removing the second fillers from the openings after developing the photosensitive resin. In some embodiments, the method further includes: dispensing a third dielectric layer around the third metallization pattern and on the second dielectric layer, the third dielectric layer including the photoinsensitive molding compound; and planarizing the third dielectric layer such that surfaces of the third dielectric layer and the third metallization pattern are planar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
dispensing a first dielectric layer around and on a first metallization pattern, the first dielectric layer comprising a photoinsensitive molding compound;
planarizing the first dielectric layer such that surfaces of the first dielectric layer and the first metallization pattern are planar;
forming a second metallization pattern on the first dielectric layer and the first metallization pattern;
dispensing a second dielectric layer around the second metallization pattern and on the first dielectric layer, wherein the second dielectric layer is in direct contact with the first dielectric layer, the second dielectric layer comprising a photosensitive molding compound;
patterning the second dielectric layer with openings exposing portions of the second metallization pattern; and forming a third metallization pattern on the second dielectric layer and in the openings extending through the second dielectric layer, the third metallization pattern coupled to the portions of the second metallization pattern exposed by the openings.

2. The method of claim 1, wherein the photoinsensitive molding compound comprises a photoinsensitive resin and first fillers disposed in the photoinsensitive resin, wherein the photosensitive molding compound comprises a photosensitive resin and second fillers disposed in the photosensitive resin, the second fillers having smaller diameters than the first fillers.

3. The method of claim 2, wherein patterning the second dielectric layer comprises:
exposing the photosensitive resin to light;
developing the photosensitive resin; and
removing the second fillers from the openings after developing the photosensitive resin.

4. The method of claim 1 further comprising:
dispensing a third dielectric layer around the third metallization pattern and on the second dielectric layer, the third dielectric layer comprising the photoinsensitive molding compound; and
planarizing the third dielectric layer such that surfaces of the third dielectric layer and the third metallization pattern are planar.

5. The method of claim 1, wherein the photoinsensitive molding compound has a greater Young's Modulus than the photosensitive molding compound, wherein the photoinsensitive molding compound has a lesser coefficient of thermal expansion than the photosensitive molding compound, wherein the photoinsensitive molding compound has a lesser dielectric constant than the photosensitive molding compound, and wherein the photoinsensitive molding compound has a lesser dissipation factor than the photosensitive molding compound.

6. The method of claim 1, wherein the first dielectric layer has a first thickness, the second dielectric layer has a second thickness, and the first thickness is greater than the second thickness.

7. The method of claim 6 further comprising:
coupling features of the first metallization pattern and the second metallization pattern to power or ground terminals; and
coupling features of the third metallization pattern to data terminals.

8. The method of claim 1 further comprising:
forming the first metallization pattern on a third dielectric layer, the third dielectric layer comprising a low temperature polyimide, the low temperature polyimide free from fillers.

9. A method comprising:
attaching a semiconductor device to a redistribution structure, the redistribution structure comprising:
a first metallization pattern comprising a first conductive line and a first conductive via, the first conductive via disposed on the first conductive line, the first conductive line electrically coupled to the semiconductor device;
a first dielectric layer surrounding the first metallization pattern, surfaces of the first dielectric layer and the first conductive via being planar, the first dielectric layer comprising a first molding compound;
a second metallization pattern comprising a second conductive line extending along a major surface of the first dielectric layer, wherein the second metallization pattern is in direct contact with the first dielectric layer;
a second dielectric layer disposed around the second metallization pattern and on the first dielectric layer, the second dielectric layer comprising a second molding compound, the second molding compound different from the first molding compound; and
a third metallization pattern comprising a third conductive line and a second conductive via, the third conductive line extending along a major surface of the second dielectric layer, the second conductive via extending through the second dielectric layer to electrically couple the second metallization pattern.

10. The method of claim 9 further comprising forming the redistribution structure, the forming comprising:
dispensing the first dielectric layer around the first metallization pattern, the first dielectric layer comprising a photoinsensitive molding compound;
planarizing the first dielectric layer such that surfaces of the first dielectric layer and the first conductive via are planar;
dispensing the second dielectric layer around the second metallization pattern, the second dielectric layer comprising a photosensitive molding compound; and
patterning the second dielectric layer with openings exposing portions of the second metallization pattern.

11. The method of claim 9, wherein the first molding compound comprises a first resin and first fillers disposed in the first resin, wherein the second molding compound comprises a second resin and second fillers disposed in the second resin, the first resin being different from the second resin, the first fillers being different from the second fillers.

12. The method of claim 9, wherein the third metallization pattern further comprises a third conductive via disposed on the third conductive line, and wherein the redistribution structure further comprises a third dielectric layer surrounding the third metallization pattern, surfaces of the third dielectric layer and the third conductive via being planar, the third dielectric layer comprising the first molding compound.

13. A method comprising:
forming a first dielectric layer on a substrate, the first dielectric layer comprising a first photosensitive molding compound, wherein the first photosensitive molding compound has a first Young's Modulus;
forming a first metallization pattern on the first dielectric layer;
forming a second dielectric layer around and on the first metallization pattern, the second dielectric layer comprising a first photoinsensitive molding compound, wherein the first photoinsensitive molding compound has a second Young's Modulus;
forming a second metallization pattern on the second dielectric layer and the first metallization pattern;
forming a third dielectric layer around the second metallization pattern and directly on the second dielectric layer, the third dielectric layer comprising a second photosensitive molding compound, wherein the second photosensitive molding compound has a third Young's Modulus, wherein the third Young's Modulus is greater than the first Young's Modulus, wherein the third Young's Modulus is less than the second Young's Modulus;
patterning the third dielectric layer with openings exposing portions of the second metallization pattern; and forming a third metallization pattern on the third dielectric layer and in the openings extending through the third dielectric layer, the third metallization pattern coupled to the portions of the second metallization pattern exposed by the openings.

14. The method of claim 13, wherein the first photoinsensitive molding compound comprises a first photoinsensitive resin and first fillers disposed in the first photoinsensitive resin, wherein the second photosensitive molding compound comprises a first photosensitive resin and second fillers disposed in the first photosensitive resin, the second fillers having smaller diameters than the first fillers, wherein the first photosensitive molding compound is free from fillers.

15. The method of claim 14, wherein the first photosensitive resin is epoxy or acrylic.

16. The method of claim 14, wherein the second fillers are silica or barium sulfate.

17. The method of claim 13, wherein a coefficient of thermal expansion of the first photoinsensitive molding compound is greater than a coefficient of thermal expansion of the second photosensitive molding compound, wherein the coefficient of thermal expansion of the first photoinsensitive molding compound is less than a coefficient of thermal expansion of the first photosensitive molding compound.

18. The method of claim 13, wherein the first dielectric layer has a first thickness, the second dielectric layer has a second thickness, the third dielectric layer has a third thickness, wherein the third thickness is greater than the first thickness, wherein the third thickness is less than the second thickness.

19. The method of claim 13, wherein the first metallization pattern comprises a first conductive line and a first conductive via, the second metallization pattern comprises a second conductive line, wherein the second conductive line is in direct contact with the first conductive via, and the third metallization pattern comprises a third conductive line and a second conductive via, wherein the second conductive via is in direct contact with the second conductive line.

20. The method of claim 19, wherein a first sidewall of the first conductive via forms a first angle $\theta 1$ with a major surface of the first conductive line, and a second sidewall of the second conductive via forms a second angle $\theta 2$ with a major surface of the second conductive line, wherein the first angle $\theta 1$ is greater than the second angle $\theta 2$.

* * * * *